US012787698B2

(12) United States Patent
Kim

(10) Patent No.: US 12,787,698 B2
(45) Date of Patent: Nov. 3, 2026

(54) MODULE TRAY COVER AND SEMICONDUCTOR DEVICE CASE INCLUDING THE SAME

(71) Applicant: Samsung Electronics Co., Ltd., Suwon-si (KR)

(72) Inventor: Taegeon Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 20 days.

(21) Appl. No.: 18/778,167

(22) Filed: Jul. 19, 2024

(65) Prior Publication Data

US 2025/0062146 A1 Feb. 20, 2025

(30) Foreign Application Priority Data

Aug. 14, 2023 (KR) ........................ 10-2023-0106183
Oct. 30, 2023 (KR) ........................ 10-2023-0146646

(51) Int. Cl.
*H10P 72/10* (2026.01)
*H10P 72/00* (2026.01)

(52) U.S. Cl.
CPC ...... *H10P 72/1922* (2026.01); *H10P 72/0618* (2026.01)

(58) Field of Classification Search
CPC ......... H01L 21/67386; H01L 21/67294; H01L 21/67333; H01L 21/67356; H01L 21/67369; H10P 72/1922; H10P 72/0618; H10P 72/16; H10P 72/1904; H10P 72/1912
See application file for complete search history.

(56) References Cited

U.S. PATENT DOCUMENTS 8,248,775 B2 8/2012 Zhang et al.
8,305,103 B2 11/2012 Kang et al.
8,649,168 B2 2/2014 Ozeki et al.
(Continued)

FOREIGN PATENT DOCUMENTS

KR 1992-0001474 1/1992
KR 1995-0002056 3/1995
(Continued)

*Primary Examiner* — Orlando E Aviles
*Assistant Examiner* — Jenine Spicer
(74) *Attorney, Agent, or Firm* — Muir Patent Law, PLLC

(57) ABSTRACT

A module tray cover includes a cover structure configured to cover a module tray that accommodates a plurality of semiconductor devices; a card accommodation portion provided on an upper surface of the cover structure and configured to accommodate a card, the card accommodation portion providing a first accommodation space and a second accommodation space partially overlapped with the first accommodation space; and an upper reinforcement structure including a first plurality of upper reinforcement structures and a second plurality of upper reinforcement structures, the first and second pluralities of upper reinforcement structures being spaced apart from each other in the first and second accommodation spaces, respectively, wherein the first and second pluralities of upper reinforcement structures respectively include first and second pluralities of upper reinforcement ribs sequentially disposed from open side portions of the first and second accommodation spaces.

18 Claims, 18 Drawing Sheets

(56) References Cited

U.S. PATENT DOCUMENTS

| | | | | |
|---|---|---|---|---|
| 10,990,553 | B2 | 4/2021 | Rust et al. | |
| 11,341,078 | B2 | 5/2022 | Yun | |
| 2011/0089079 | A1* | 4/2011 | Lo | H01L 21/67333 206/711 |
| 2014/0166533 | A1* | 6/2014 | Ernstberger | H01L 21/67369 206/710 |
| 2014/0262928 | A1* | 9/2014 | Han | G01R 31/2893 206/711 |
| 2017/0186636 | A1* | 6/2017 | Lo | H01L 21/67333 |
| 2022/0328334 | A1* | 10/2022 | Lee | H01L 21/67346 |

FOREIGN PATENT DOCUMENTS

| | | | |
|---|---|---|---|
| KR | 1997-0003261 | | 1/1997 |
| KR | 0124549 | B1 | 2/1999 |
| KR | 20-0188663 | | 7/2000 |
| KR | 2002-0097441 | A | 12/2002 |
| KR | 10-1562018 | B1 | 10/2015 |
| KR | 10-2017-0006240 | A | 1/2017 |
| KR | 10-2091704 | B1 | 3/2020 |

* cited by examiner

10

MODULE TRAY COVER AND SEMICONDUCTOR DEVICE CASE INCLUDING THE SAME

PRIORITY STATEMENT

This application claims priority under 35 U.S.C. § 119 to Korean Patent Application Nos. 10-2023-0106183, filed on Aug. 14, 2023 and 10-2023-0146646, filed on Oct. 30, 2023 in the Korean Intellectual Property Office (KIPO), the contents of which are herein incorporated by reference in their entirety.

BACKGROUND

1. Field

Example embodiments relate to a module tray cover and a semiconductor device case including the same. More particularly, example embodiments relate to a module tray cover configured to cover a module tray that accommodates a plurality of semiconductor devices therein and a semiconductor device case including the same.

2. Description of the Related Art

A semiconductor device case may be used to store and operate a plurality of semiconductor devices. The semiconductor device case may include a module tray and a module tray cover to prevent foreign substances, particles, etc. from contaminating semiconductor devices. In case that a force is applied on the module tray cover, a warpage may occur because the module tray cover has a relatively thin thickness. Additionally, the module tray cover may have brackets that are configured to guide and accommodate a card. In this case, a reinforcement structure may be applied to prevent the warpage. However, the reinforcement structure may be an obstacle to the card being introduced through the brackets. Further, if a plurality of module trays are stacked, a band securing the semiconductor device case may easily come off or break away.

SUMMARY

Example embodiments provide a module tray cover having a plurality of reinforcement structures that are able to prevent a warpage and easily introduce a card into an accommodation space.

Example embodiments provide a semiconductor device case including the module tray cover.

According to example embodiments, a module tray cover includes a cover structure configured to cover a module tray that accommodates a plurality of semiconductor devices; a card accommodation portion provided on an upper surface of the cover structure and configured to accommodate a card, the card accommodation portion providing a first accommodation space and a second accommodation space, the first accommodation space extending in a first horizontal direction, the second accommodation space extending in a second horizontal direction perpendicular to the first horizontal direction and partially overlapped with the first accommodation space; and an upper reinforcement structure including a first plurality of upper reinforcement structures and a second plurality of upper reinforcement structures, the first plurality of upper reinforcement structures being spaced apart from each other along the first horizontal direction and protruding from the upper surface of the cover structure in the first accommodation space, the second plurality of upper reinforcement structures being spaced apart from each other along the second horizontal direction and protruding from the upper surface of the cover structure in the second accommodation space, wherein the first plurality of upper reinforcement structures includes first, second and third upper reinforcement ribs sequentially disposed along the first horizontal direction from a first open side portion of the first accommodation space through which the card is inserted in the first horizontal direction, each of the first, second and third upper reinforcement ribs providing an inclined portion that has an inclined surface facing the first open side portion of the first accommodation space; and wherein the second plurality of upper reinforcement structures includes fourth, fifth and sixth upper reinforcement ribs sequentially disposed along the second horizontal direction from a second open side portion of the second accommodation space through which the card is inserted in the second horizontal direction, each of the fourth, fifth and sixth upper reinforcement ribs providing an inclined portion that has an inclined surface facing the second open side portion of the second accommodation space.

According to example embodiments, a module tray cover includes a cover structure configured to cover a module tray that accommodates a plurality of semiconductor devices, the cover structure provided with first and second side covers extending in a first horizontal direction and facing each other and third and fourth side covers extending in a second horizontal direction perpendicular to the first horizontal direction and facing each other, the cover structure providing an upper region adjacent to the first side cover and a lower region adjacent to the second side cover; a card accommodation portion provided on the upper region of the cover structure and configured to accommodate a card, the card accommodation portion having a first accommodation space extending in the first horizontal direction and a second accommodation space extending in the second horizontal direction; a tag accommodation portion provided on the lower region of the cover structure and configured to accommodate a data storage device that stores data of the plurality of semiconductor devices, the tag accommodation portion including first and second protection walls extending in the first horizontal direction and facing each other, the tag accommodation portion including third and fourth protection walls extending in the second horizontal direction and facing each other; and a lower reinforcement structure disposed between the first, second, third and fourth protection walls, the lower reinforcement structure including a first lower reinforcement structure parallel with the first horizontal direction and a second lower reinforcement structure parallel with the second horizontal direction, wherein the first lower reinforcement structure includes at least one lower reinforcement rib between the first protection wall and the second protection wall, the at least one lower reinforcement rib extending between the third protection wall and the fourth protection wall, and wherein the second lower reinforcement structure includes multiple lower reinforcement ribs sequentially arranged in the first horizontal direction between the third protection wall and the fourth protection wall, the multiple lower reinforcement ribs extending between the first protection wall and the second protection wall.

According to example embodiments, a semiconductor device case includes a module tray configured to accommodate a plurality of semiconductor devices, the module tray having an open upper surface; a module tray cover detachably provided on the module tray, the module tray cover including a cover structure configured to cover the open upper surface; a card accommodation portion provided on the upper region of the cover structure and configured to accommodate a card, the card accommodation portion having a first accommodation space extending in a first horizontal direction and a second accommodation space extending in a second horizontal direction; a first plurality of upper reinforcement structures including first, second and third upper reinforcement ribs that are sequentially disposed along the first horizontal direction from a first open side portion of the first accommodation space; a second plurality of upper reinforcement structures including fourth, fifth and sixth upper reinforcement ribs that are sequentially disposed along the second horizontal direction from a second open side portion of the second accommodation space; a tag accommodation portion spaced apart from the card accommodation portion along the second horizontal direction and configured to accommodate a data storage device that stores data of the plurality of semiconductor devices, the tag accommodation portion including first and second protection walls extending in the first horizontal direction and facing each other, the tag accommodation portion including third and fourth protection walls extending in the second horizontal direction and facing each other; and a lower reinforcement structure disposed between the first to fourth protection walls, the lower reinforcement structure having a lower reinforcement structure parallel with the first horizontal direction and a plurality of lower reinforcement structures parallel with the second horizontal direction According to example embodiments, a semiconductor device case may include a module tray including an open upper surface and a module tray cover configured to cover the module tray. The module tray cover may include a cover structure, a card accommodation portion provided on an upper surface of the cover structure, an upper reinforcement structure provided in an accommodation space of the card accommodation portion, a tag accommodation portion spaced apart from the card accommodation portion, a lower reinforcement structure provided in the tag accommodation portion, and a banding guide provided on a side portion of the cover structure.

A plurality of contact portions may be provided on a lower surface of the cover structure. The plurality of contact portions may be in contact with upper surfaces of a plurality of semiconductor devices which are accommodated in the module tray, so the plurality of contact portions, may secure the plurality of semiconductor devices.

Accordingly, the plurality of contact portions may prevent the plurality of semiconductor devices from being damaged due to shaking of the module tray.

The cover structure of the module tray cover may cover the open upper surface of the module tray in which the plurality of semiconductor devices is exposed.

Accordingly, the cover structure may block foreign substances, particles, etc. from flowing into the plurality of semiconductor devices in the module tray.

The card accommodation portion may include a plurality of brackets for introducing or accommodate a card including information about the plurality of semiconductor devices which are accommodated in the module tray.

Accordingly, when it is difficult to recognize a data of the plurality of semiconductor devices which are accommodated in the module tray, the data of the plurality of semiconductor devices may be easily recognized using the card. Additionally, the card may be easily accommodated through the plurality of brackets.

The upper reinforcement structure and the lower reinforcement structure may include a plurality of upper reinforcement ribs and a plurality of lower reinforcement ribs extending in a first horizontal direction or a second horizontal direction perpendicular to the first horizontal direction. Each of the plurality of upper reinforcement ribs of the upper reinforcement structure may provide an inclined portion that has an inclined surface.

Accordingly, the upper reinforcement structure and the lower reinforcement structure may increase a rigidity of the module tray cover, so a warpage of the module tray cover may be reduced. Additionally, the inclined portion of each of the upper reinforcement structures may prevent the card from being damaged while the card is introduced into the accommodation space.

The banding guide may include a pair of banding guide structures, the banding guide structures being spaced apart from each other in the first horizontal direction or the second horizontal direction. A band may be located between the pair of banding guide structures, the band being configured to secure the semiconductor device case.

Accordingly, the pair of banding guide structures may prevent the band from sliding away from its intended position.

Additionally, the module tray cover may further include a radio frequency identification (RFID) tag that stores data about the plurality of semiconductor devices, wherein the radio frequency identification tag may be provided in the tag accommodation portion.

Accordingly, the data about the plurality of semiconductor devices may be easily tracked through the radio frequency identification tag. Additionally, the tag accommodation portion may prevent the radio frequency identification tag from being damaged.

DETAILED DESCRIPTION OF EXAMPLE EMBODIMENTS

Figure 1:
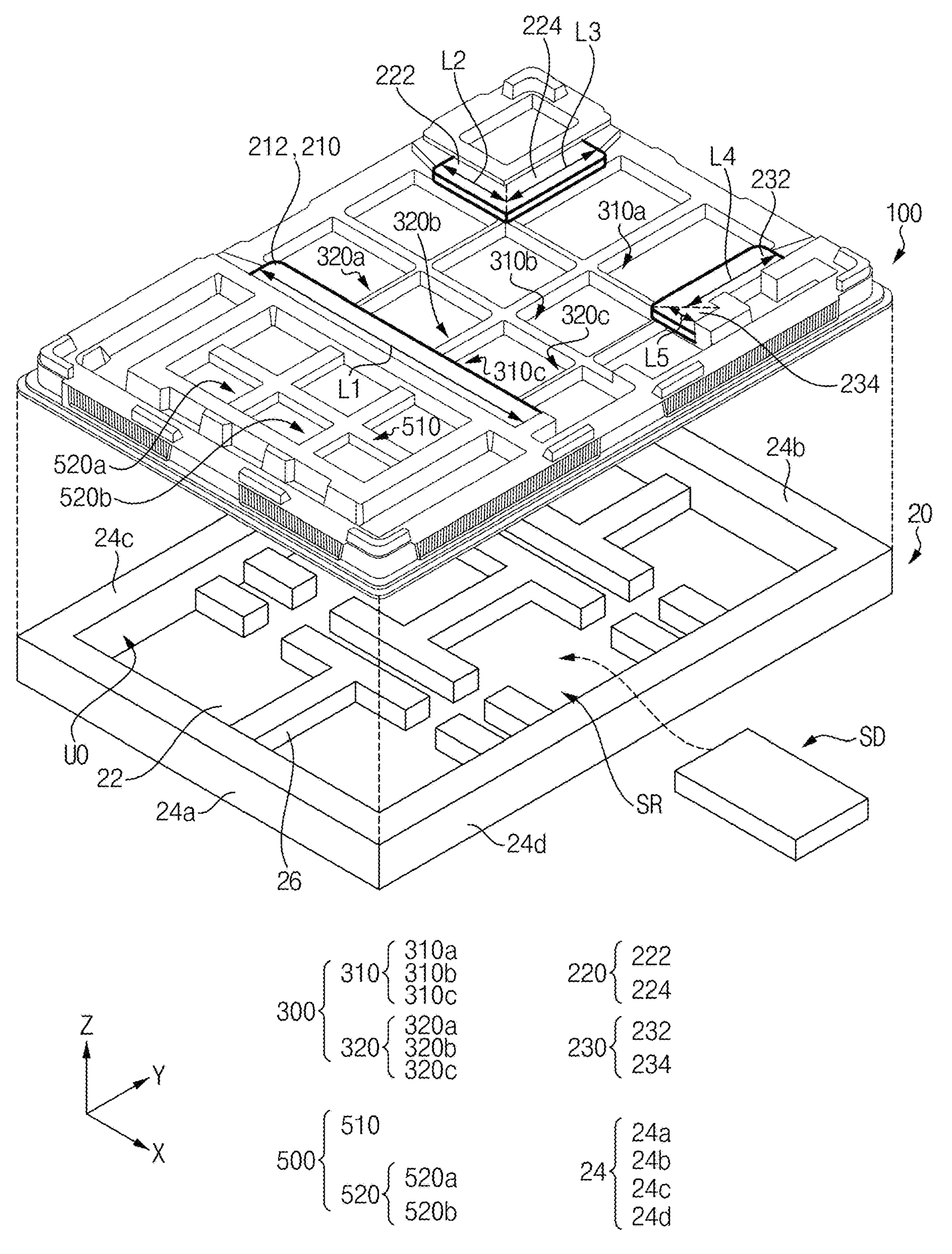
FIG. 1 is a perspective view illustrating a semiconductor device case in accordance with example embodiments.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

It will be understood that when an element is referred to as being “connected” or “coupled” to or “on” another element, it can be directly connected or coupled to or on the other element or intervening elements may be present. In contrast, when an element is referred to as being “directly connected” or “directly coupled” to another element, or as “contacting” or “in contact with” another element (or using any form of the word “contact”), there are no intervening elements present at the point of contact.

Terms such as “same,” “parallel,” and “perpendicular,” as used herein encompass identicality or near identicality including variations that may occur resulting from conventional manufacturing processes.

Throughout the specification, when a component is described as “including” a particular element or group of elements, it is to be understood that the component is formed of only the element or the group of elements, or the element or group of elements may be combined with additional elements to form the component, unless the context indicates otherwise. The term “consisting of,” on the other hand, indicates that a component is formed only of the element(s) listed.

Ordinal numbers such as “first,” “second,” “third,” etc. may be used below simply as labels of certain elements, steps, etc., to distinguish such elements, steps, etc. from one another. Terms that are not described using “first,” “second,” etc., in the specification, may still be referred to as “first” or “second” in a claim. In addition, a term that is referenced with a particular ordinal number (e.g., “first” in a particular claim) may be described elsewhere with a different ordinal number (e.g., “second” in the specification or another claim).

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using “first,” “second,” etc., in the specification, it may still be referred to as “first” or “second” in a claim in order to distinguish different claimed elements from each other.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as “beneath,” “below,” “lower,” “above,” “upper,” “top,” “bottom,” and the like, may be used herein for ease of description to describe one element’s or feature’s relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as “below” or “beneath” other elements or features would then be oriented “above” the other elements or features. Thus, the term “below” can encompass both an orientation of above and below. The device may be otherwise oriented (rotated 90 degrees or at other orientations) and the spatially relative descriptors used herein interpreted accordingly.

Spatially relative terms, such as “beneath,” “below,” “lower,” “above,” “upper,” “top,” “bottom,” “front,” “rear,” and the like, may be used herein for ease of description to describe positional relationships, such as illustrated in the figures, for example. It will be understood that the spatially relative terms encompass different orientations of the device in addition to the orientation depicted in the figures.

Also these spatially relative terms such as “above” and “below” as used herein have their ordinary broad meanings—for example element A can be above element B even if when looking down on the two elements there is no overlap between them (just as something in the sky is generally above something on the ground, even if it is not directly above).

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Although the figures described herein may be referred to using language such as “one embodiment,” or “certain embodiments,” these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary embodiment.

It will be understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Hereinafter, example embodiments will be described as follows with reference to the accompanying drawings. Items described in the singular herein may be provided in plural, as can be seen, for example, in the drawings. Thus, the description of a single item that is provided in plural should be understood to be applicable to the remaining plurality of items unless context indicates otherwise.

As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that—examples and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of layers and regions may be exaggerated for clarity. Like numbers refer to like elements throughout. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

Figure 2:
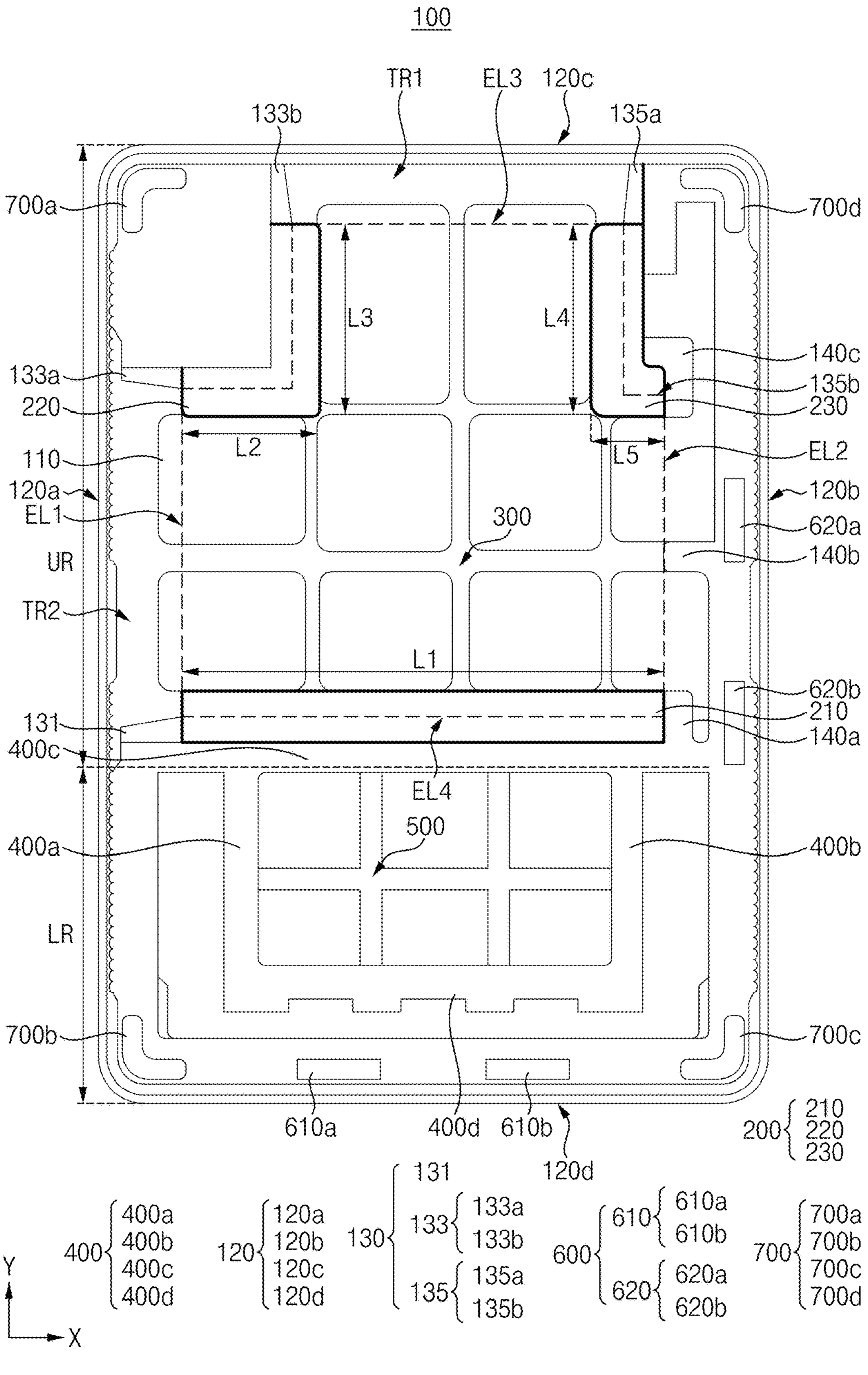
FIG. 2 is a plan view illustrating the module tray cover for the semiconductor device case of FIG. 1.

FIG. 1 is a perspective view illustrating a semiconductor device case in accordance with example embodiments. FIG. 2 is a plan view illustrating the module tray cover for the case of FIG. 1.

Referring to FIGS. 1 and 2, a semiconductor device case 10 may include a module tray 20 that is configured to accommodate a plurality of semiconductor devices SD and a module tray cover 100 that is configured to cover the module tray 20. The module tray cover 100 may include a cover structure 110 configured to cover the module tray 20, a card accommodation portion 200 configured to accommodate a card on the cover structure 110, an upper reinforcement structure 300 provided in accommodation spaces S1 and S2 of the card accommodation portion 200, a tag accommodation portion 400 spaced apart from the card accommodation portion 200, a lower reinforcement structure 500 provided in the tag accommodation portion 400, and a banding guide 600 provided in a side portion of the cover structure 110. Additionally, the module tray cover 100 may further include a plurality of anti-slip pads 700.

In example embodiments, the semiconductor device case 10 may be a device for stably holding, storing, and transporting a plurality of semiconductor devices SD. The semiconductor device case 10 may protect the plurality of semiconductor devices SD from external impacts. The semiconductor device case 10 may provide an internal space SR that is configured to simultaneously store and transport the plurality of semiconductor devices SD.

In some examples, the plurality of semiconductor devices SD accommodated in the semiconductor device case 10 may vary in type and/or size. In some examples, some or all of the plurality of semiconductor devices SD accommodated in the semiconductor device case 10 may include substrates. In some examples, some or all of the plurality of semiconductor devices (SD) may be electronic devices or modules, such as volatile or non-volatile memory modules. For instance, in some examples, the plurality of semiconductor devices SD may be solid state drives (SSDs), each of which may include a substrate—such as a printed circuit board (PCB)—on which one or more semiconductor packages are mounted or formed. The printed circuit board may be a multilayer circuit board having vias and wiring (such as conductive traces) to connect the semiconductor packages thereon. The semiconductor packages may include semiconductor memory chips such as NAND flash memory chips or dynamic random-access memory (DRAM) chips. For example, the DRAM chips may include DDR3, DDR4, DDR5, LPDDR (Low Power Double Data Rate), and the like. The semiconductor devices SD may be other memory system products such as memory cards, etc. The semiconductor device case 10 may serve as a carrier for the semiconductor devices SD by loading the semiconductor devices SD therein.

The module tray 20 may be a box that has a cuboidal shape and includes at least an opened portion of an upper surface. The module tray 20 may include a base plate 22, first and second sidewalls 24*a* and 24*b* facing each other, and third and fourth sidewalls 24*c* and 24*d* extending between the first and second sidewalls 24*a* and 24*b* to define an interior space SR. Additionally, the module tray 20 may include a plurality of inner walls 26 that divides the interior space SR in which a plurality of semiconductor devices are accommodated. The module tray 20 may accommodate the plurality of semiconductor devices SD in the interior space SR defined by the base plate 22, the first to fourth sidewalls 24*a*, 24*b*, 24*c*, 24*d*, and the plurality of inner walls 26. The module tray 20 may have the opened portion of the upper surface opening, through which each of the plurality of semiconductor devices SD is accommodated or removed.

Hereinafter, the module tray cover of FIG. 1 will be described in detail.

Figure 3:
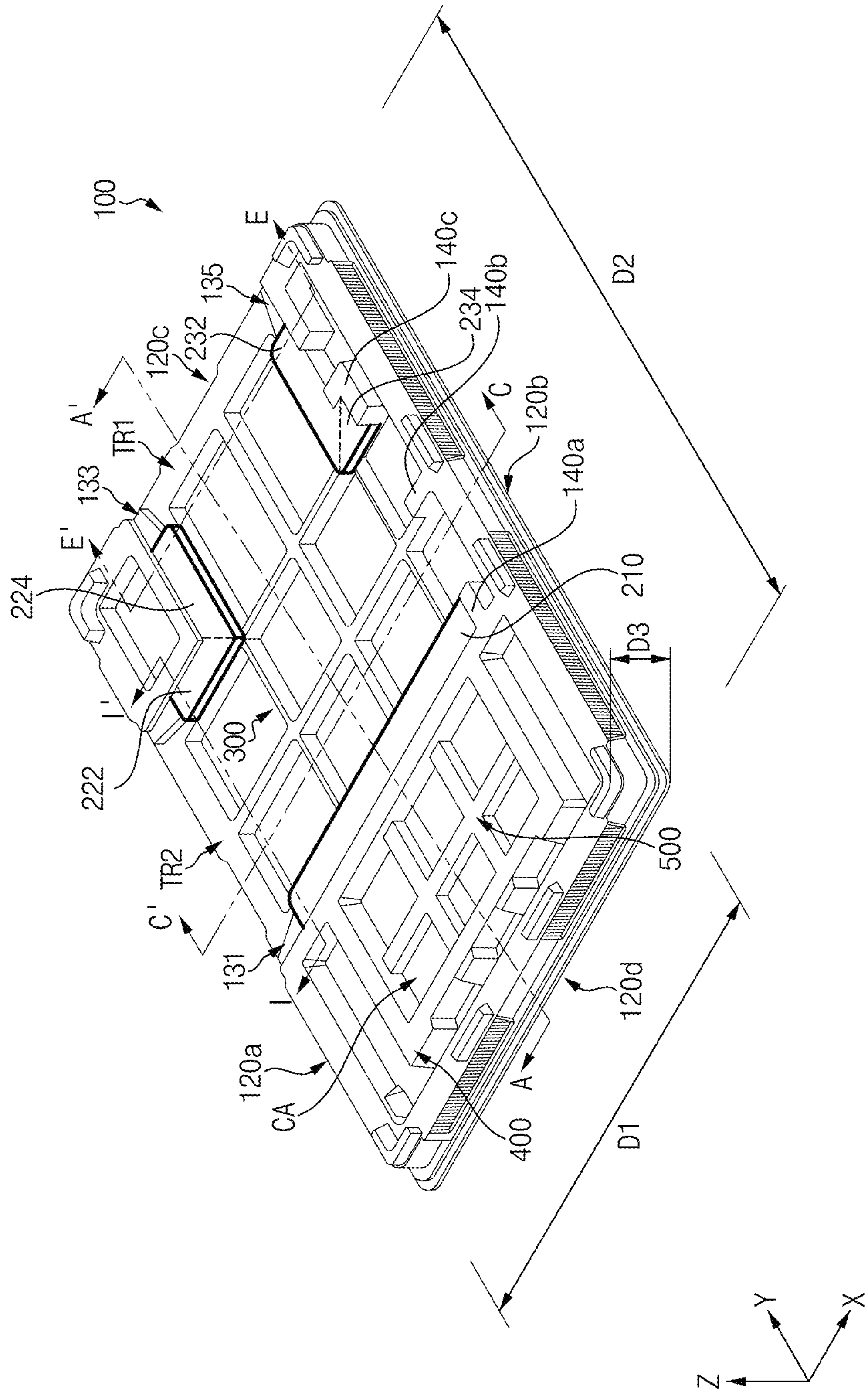
FIG. 3 is a perspective view illustrating the module tray cover for the semiconductor device case of FIG. 1.
Figure 4:
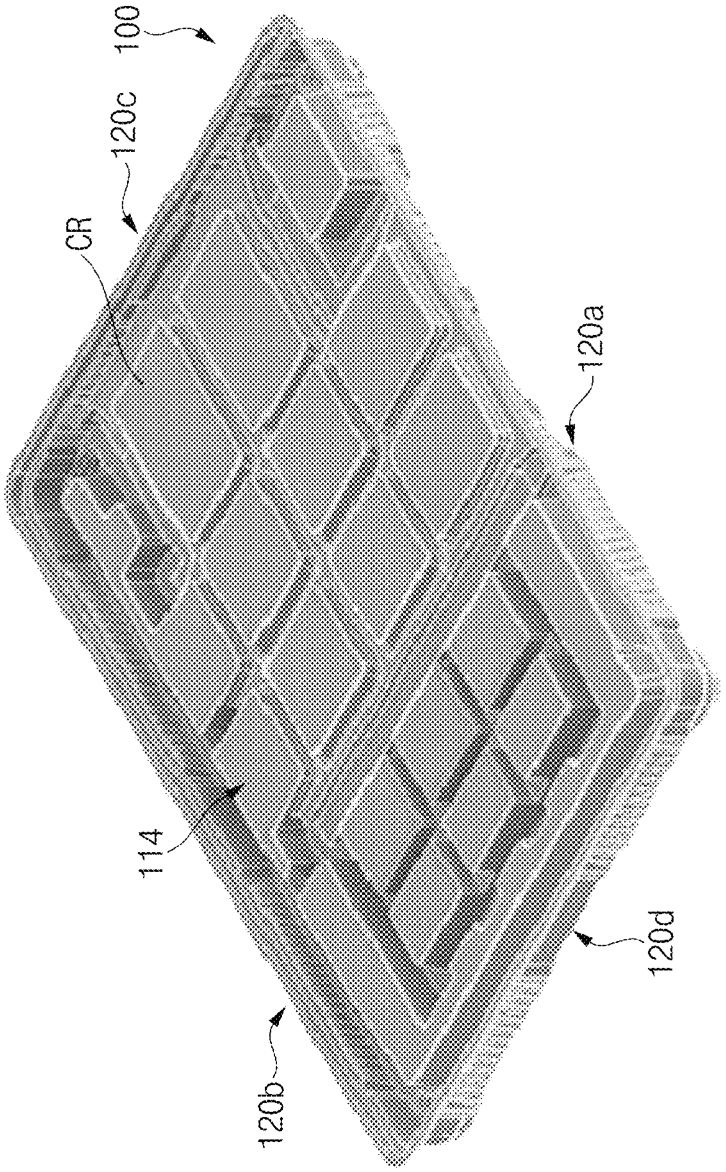
FIG. 4 is a perspective view illustrating the backside surface of the module tray cover of FIG. 3.
Figure 5:
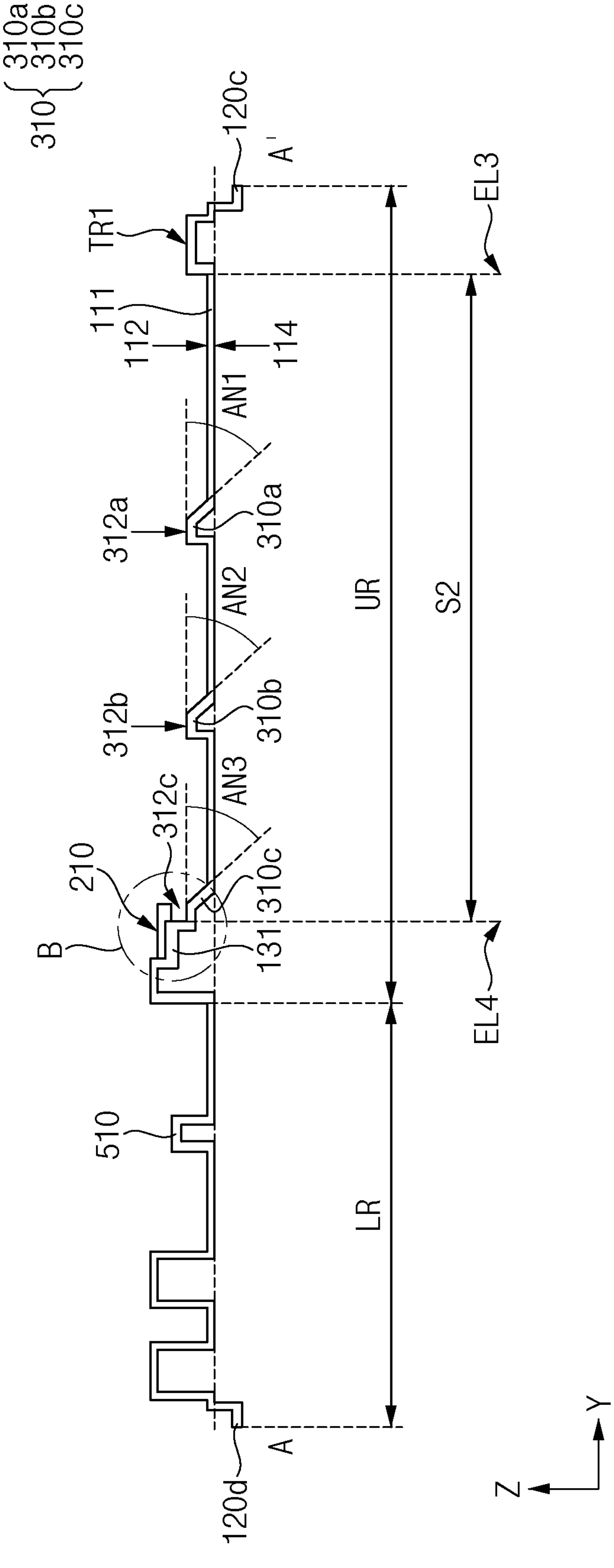
FIG. 5 is a cross-sectional view taken along the line A-A' in FIG. 3.
Figure 6:
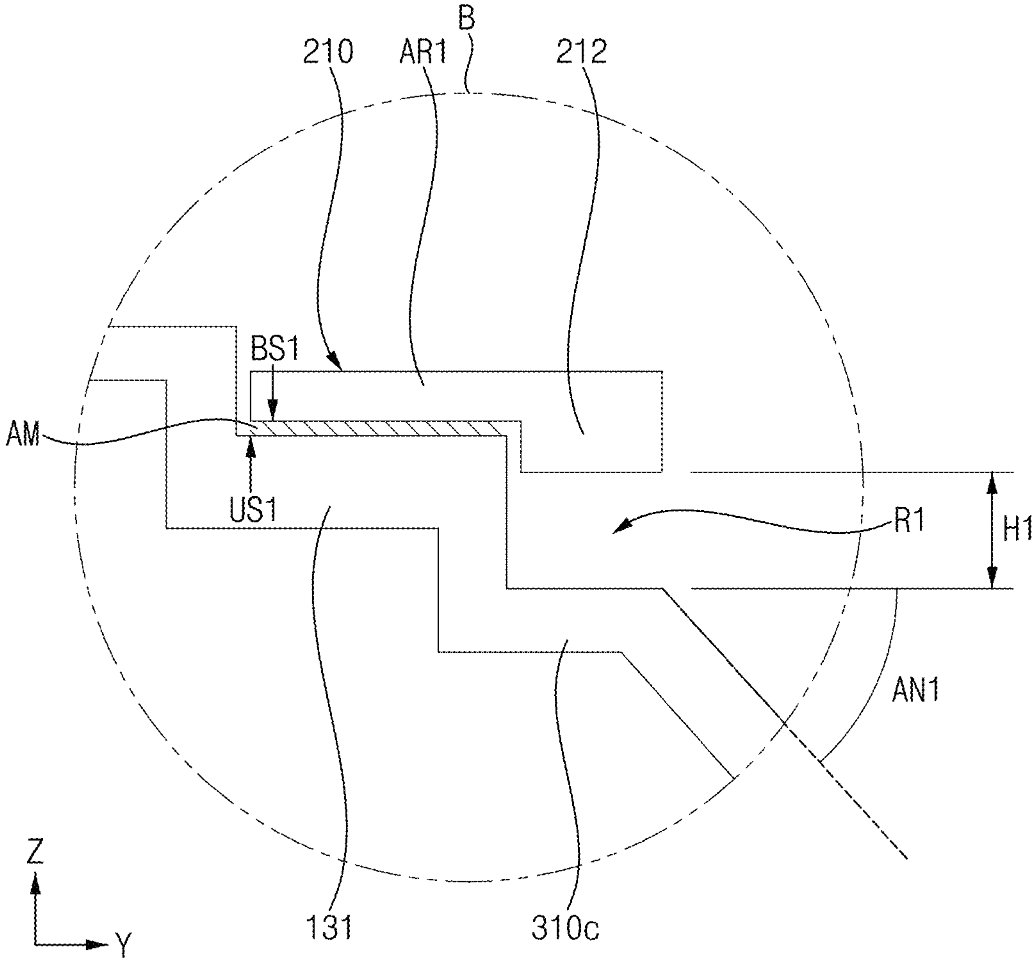
FIG. 6 is an enlarged plan view illustrating portion 'B' in FIG. 5.
Figure 7:
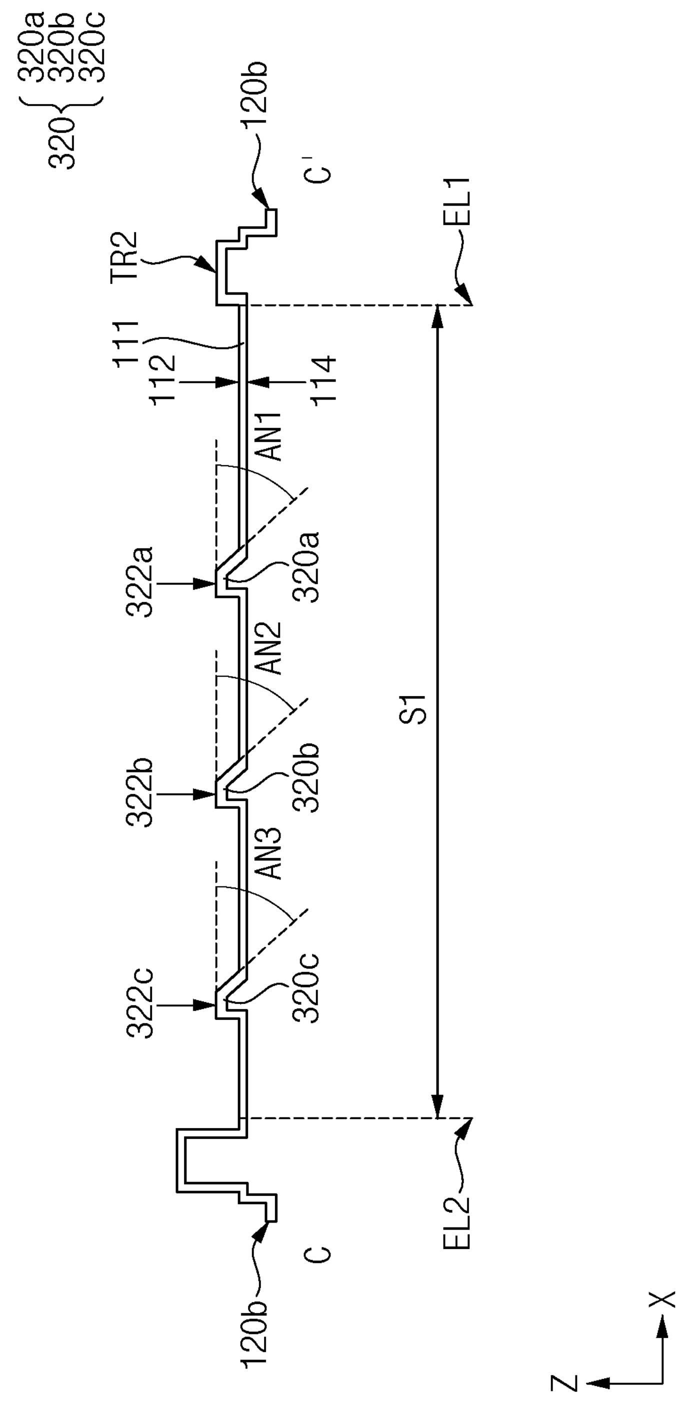
FIG. 7 is a cross-sectional view taken along the line C-C' in FIG. 3.
Figure 8:
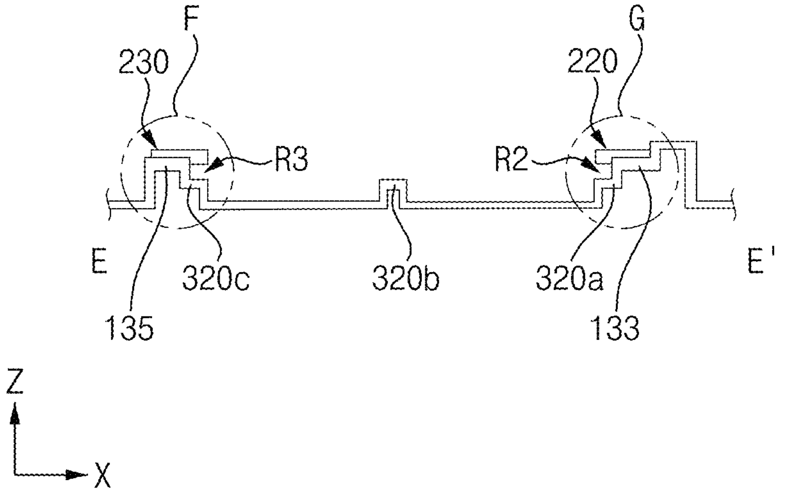
FIG. 8 is a cross-sectional view taken along the line E-E' in FIG. 3.
Figure 9:
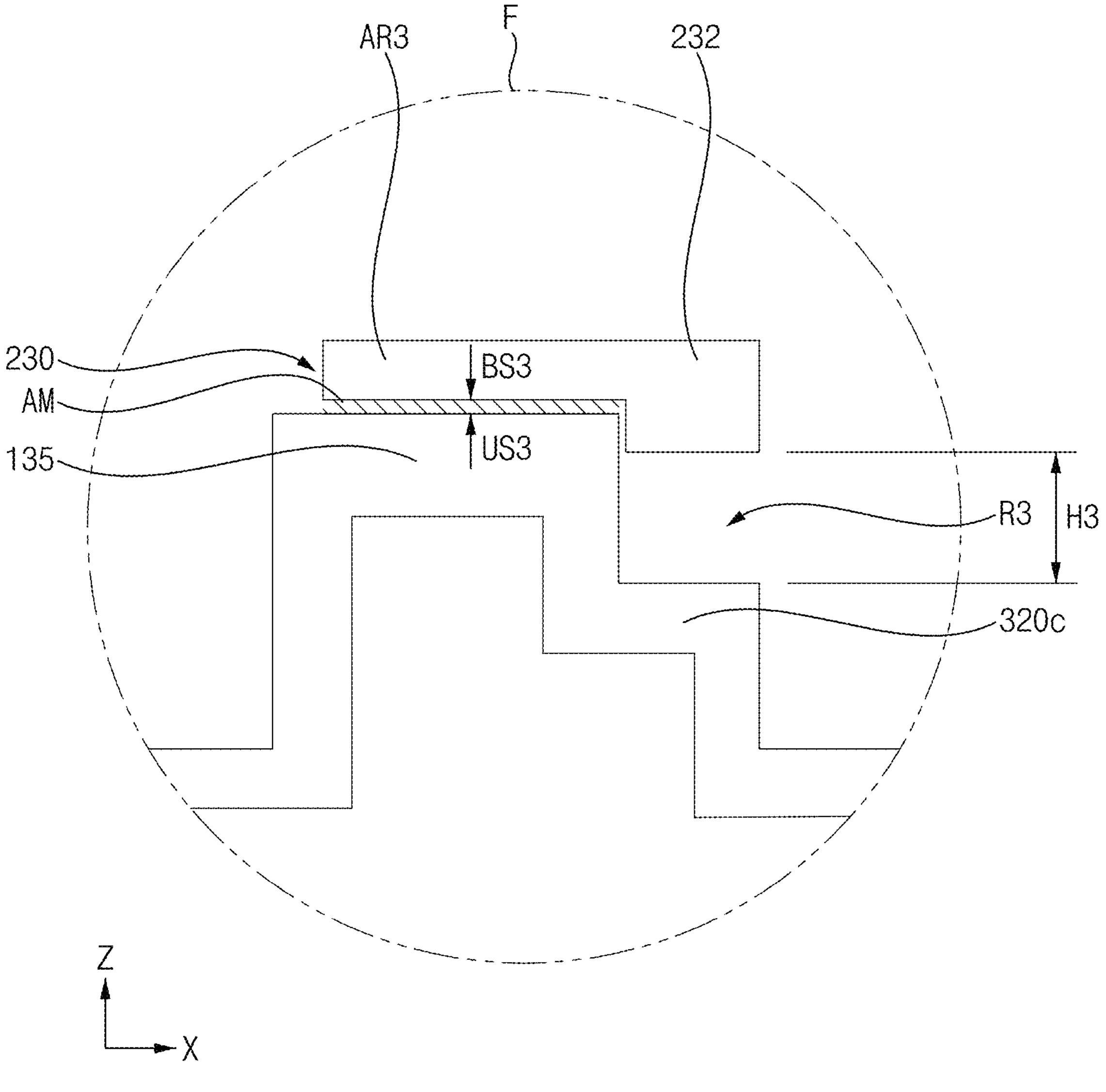
FIG. 9 is an enlarged plan view illustrating portion 'F' in FIG. 8.
Figure 10:
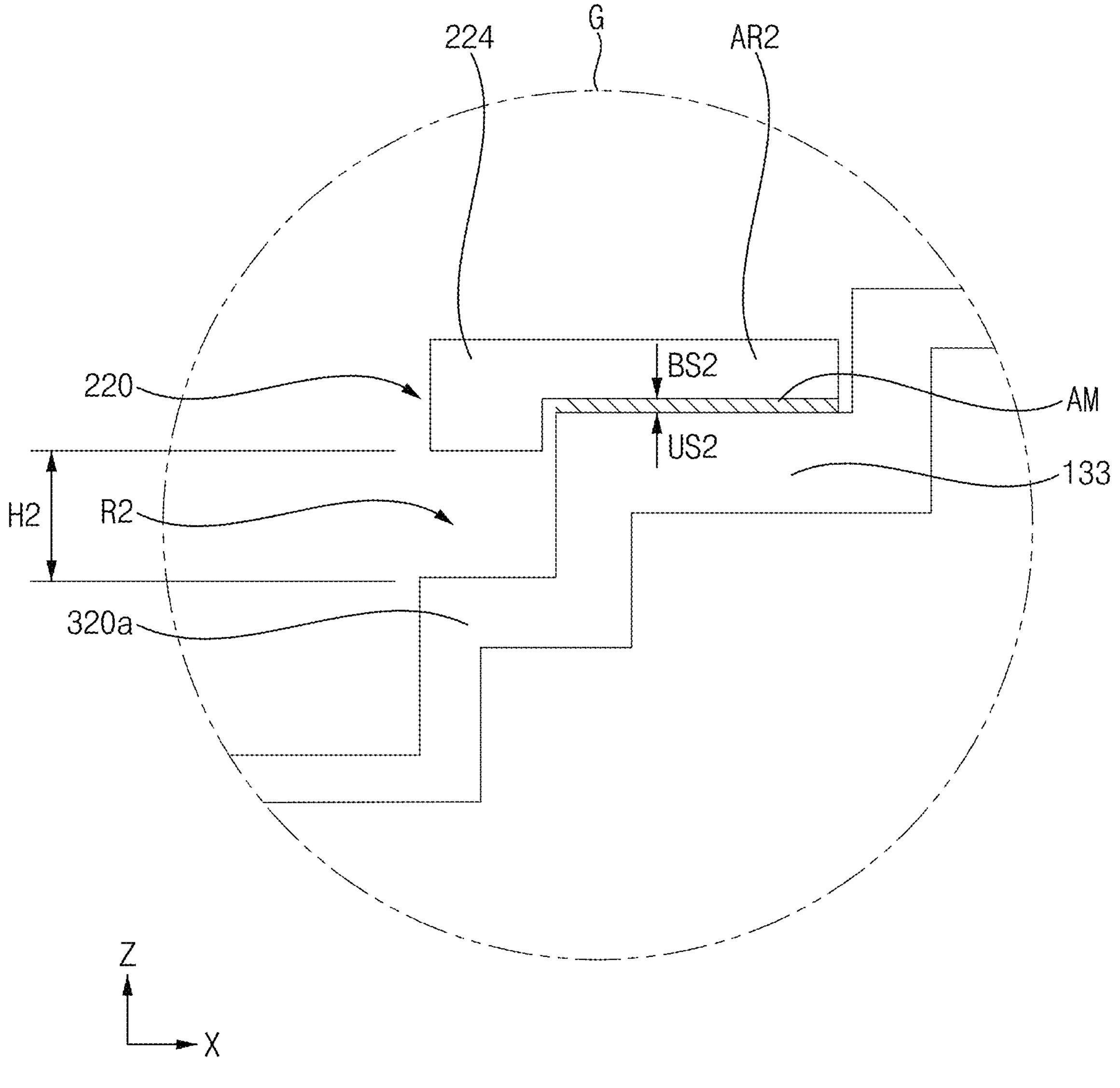
FIG. 10 is an enlarged plan view illustrating portion 'G' in FIG. 8.
Figure 11:
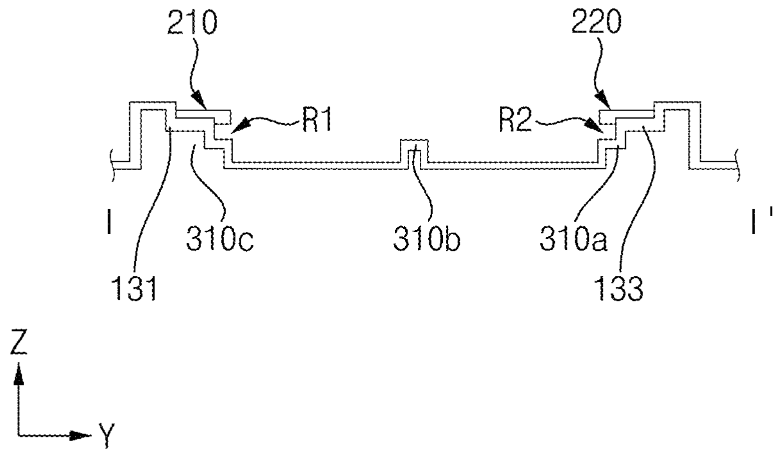
FIG. 11 is a cross-sectional view taken along the line I-I' in FIG. 3.

FIG. 2 is a plan view illustrating the module tray cover in FIG. 1. FIG. 3 is a perspective view illustrating the module tray cover in FIG. 1. FIG. 4 is a perspective view illustrating a backside surface of the module tray cover in FIG. 3. FIG. 5 is a cross-sectional view taken along the line A-A' in FIG. 3. FIG. 6 is an enlarged plan view illustrating portion 'B' in FIG. 5. FIG. 7 is a cross-sectional view taken along the line C-C' in FIG. 3. FIG. 8 is a cross-sectional view taken along the line E-E' in FIG. 3. FIG. 9 is an enlarged plan view illustrating portion 'F' in FIG. 8. FIG. 10 is an enlarged plan view illustrating portion 'G' in FIG. 8. FIG. 11 is a cross-sectional view taken along the line I-I' in FIG. 3.

Referring to FIGS. 2 to 11, the module tray cover 100 may cover the module tray 20 that is configured to accommodate the plurality of semiconductor devices SD. The module tray cover 100 may cover an open upper surface UO of the module tray 20. The module tray cover 100 may be coupled to or detached from the module tray 20 to protect the plurality of semiconductor devices SD accommodated within the module tray 20 from the outside.

If the plurality of semiconductor devices SD are inserted into an interior space of the module tray 20, the module tray cover 100 may protect the plurality of semiconductor devices SD accommodated therein from external impact. If the plurality of semiconductor devices SD is not accommodated, the module tray cover 100 may be stored and managed individually, and for example, a plurality of module tray covers 100 may be stacked on one another, since the module tray cover 100 has a cuboidal shape.

The module tray cover 100 may include a metallic material such as stainless steel except for the card accommodation portion 200. Alternatively, the module tray cover 100 excluding the card accommodation portion 200 may include a plastic material. For example, the plastic material may include polystyrene (PS).

In some examples, the card accommodation portion 200 may be formed of different material(s) than other portion(s) of the module tray cover 100. In one example, the card accommodation portion 200 may include a metallic material, such as stainless steel, while the remaining portions of the module tray cover 100 are formed of a plastic material. In another example, the card accommodation portion 200 may include a plastic material, while the remaining portions of the module tray cover 100 are formed of a metallic material, such as stainless steel. In some examples in which the card accommodation portion 200 includes a plastic material, the plastic material may include a styrene resin. The styrene resin may include an acrylonitrile butadiene styrene (ABS). The styrene resin has a relatively low melting point, so the styrene resin may be easily processed into a desired shape.

In example embodiments, a cover structure 110 may be provided with a plate 111 having an upper surface 112 and a lower surface 114 facing away from each other, first, second, third and fourth side covers 120*a*, 120*b*, 120*c* and 120*d* surrounding a plurality of side portions of the plate 111, and first, second and third support structures 131, 133, and 135 provided on an upper surface 112 of the plate 111. Additionally, the cover structure 110 may further be provided with a plurality of protrusions 140*a*, 140*b*, and 140*c*.

The plate 111 may be provided with a plurality of contact portions CR provided on a lower surface 114 of the plate 111. The plurality of contact portions may have various sizes and shapes and may be distributed across the lower surface 114 of the plate 111. The plurality of contact portions may be structures that are configured to contact and secure the plurality of semiconductor devices SD which are accommodated within the module tray 20.

The plurality of side covers 120 may include the first and second side covers 120*a* and 120*b* opposite to each other and the third and fourth side covers 120*c* and 120*d* opposite to each other.

In this specification in connection with orientations, a direction between the first side cover 120*a* and the second side cover 120*b* may be referred to as a first horizontal direction (X direction), a direction between the third side cover 120*c* and the fourth side cover 120*d* may be referred to as a second horizontal direction (Y direction), and a direction perpendicular to the first horizontal direction and the second horizontal direction may be referred to as a vertical direction (Z direction).

The cover structure 110 may be provided with an upper region UR adjacent to the third side cover 120*c* and a lower region LR spaced apart from the upper region UR in the second horizontal direction (Y direction) and adjacent to the fourth side cover 120*d*.

The first, second and third support structures 131, 133, and 135 may include first, second and third upper surfaces US1, US2, and US3 respectively, and may be disposed on the upper region UR of the cover structure 110. The first, second and third upper surfaces may be regions on which the card accommodation portion 200 is attached as will be described later. The first to third protrusions 140*a*, 140*b*, and 140*c* may be arranged sequentially along the second horizontal direction (Y direction) to be adjacent to the second side cover 120*b*. End portions of the first and third protrusions 140*a*, 140*b*, and 140*c* may be aligned to provide a line extending in the second horizontal direction, which may constitute an extension line of a first closed side portion EL2 of a first accommodation space S1. The first protrusion 140*a* may be provided adjacent to an end portion of the first support structure 131, and the third protrusion 140*c* may be provided adjacent to an end portion of the third support structure 135. The second protrusion 140*b* may be provided between the first protrusion 140*a* and the third protrusion 140*c*.

For example, a first distance D1 between the first side cover 120*a* and the second side cover 120*b* may be smaller than a second distance D2 between the third side cover 120*c* and the fourth side cover 120*d*. The first distance D1 between the first side cover 120*a* and the second side cover 120*b* may be within a range of 200 mm to 300 mm. For example, the first distance D1 may be about 241.5 mm. The second distance D2 between the third side cover 120*c* and the fourth side cover 120*d* may be within a range of 250 mm to 400 mm. For example, the second distance D2 may be about 343.5 mm. A height from the lower surface to the upper surface of the cover structure 110 may be a third distance D3. The third distance D3 may be within a range of 15 mm to 20 mm. For example, the third distance D3 may be about 20 mm.

The cover structure 110 may be formed by a compression molding process.

Alternatively, the cover structure 110 may be formed by an injection molding process, an extrusion molding process, a transfer molding process, a laminating molding process, a casting process, a thermoforming process, or the like. The cover structure 110 formed by the compression molding process may have a small thickness. For example, a thickness of the cover structure 110 may be within a range of 0.5 mm to 3 mm.

In example embodiments, a card accommodation portion 200 may be provided on the upper surface of the cover structure 110. The card accommodation portion 200 may accommodate the card CA on which information of the semiconductor device SD is recorded. The card accommodation portion 200 may selectively accommodate the card CA in the first horizontal direction (X direction) or the second horizontal direction (Y direction).

The card accommodation portion 200 may be provided with first, second and third brackets 210, 220, and 230 configured to accommodate the card CA. The card accommodation portion 200 may accommodate the card CA within first and second accommodation spaces S1 and S2 that are defined by the cover structure 110 and the first, second and third brackets 210, 220 and 230. The first accommodation space S1 may be a space in which the card CA may be received in the first horizontal direction (X direction), and the second accommodation space S2 may be a space in which the card CA may be received in the second horizontal direction (Y direction). The first accommodation space and the second accommodation space may partially overlap with each other.

The card CA may include a lot card. The lot card may include thin paper, plastic, or the like. The lot card may have a square shape. The card accommodation portion 200 may be varied depending on the type, size, and material of the lot card.

The lot card may include data of the semiconductor device. The lot card may display the data recorded by an operator on a surface the lot card. The lot card may include the data about a manufacturing process of the semiconductor device in a semiconductor production management system. For example, the data may include a model name, a model number, a manufacturing date, an inspection date, a quantity, a process progress, and the like.

The first accommodation space S1 may be provided with a first trench TR1 through which the card CA is inserted, and may include a first open side portion EL1 adjacent to the first side cover 120*a* of the cover structure 110, the first, second and third protrusions 140*a*, 140*b* and 140*c*, and a first closed side portion EL2 adjacent to the second side cover 120*b* of the cover structure 110.

The second accommodation space S2 may have a second trench TR2 through which the card CA is inserted, and may include a second open side portion EL3 adjacent to the third side cover 120*c* of the cover structure 110, the first support structure 131 configured to secure the card CA, and a second closed side portion EL4 provided in the upper region UR adjacent to the lower region LR of the cover structure 110.

In example embodiments, the first bracket 210 may be provided with a first accommodation guide 212 and a first attachment portion AR1 provided on the cover structure 110. A thickness of the first accommodation guide 212 may be greater than a thickness of the first attachment portion AR1. The first bracket 210 may be fixedly attached to the cover structure 110. For example, the first attachment portion AR1 of the first bracket 210 may be attached on the first support structure 131 of the cover structure 110. A first lower surface BS1 of the first attachment portion AR1 may be attached on a first upper surface US1 of the first support structure 131 by an adhesive member AM.

The first accommodation guide 212 may extend in the first horizontal direction (X direction) on the cover structure 110. The first bracket 210, the second bracket 220, and the third bracket 230 may guide the card CA into the first accommodation space S1.

The first accommodation guide 212 may guide the card CA into the first accommodation space S1. For example, the first accommodation space S1 may be defined by the first accommodation guide 212, a second accommodation guide 222 of the second bracket 220 and a fifth accommodation guide 234 of the third bracket 230. The card CA may be guided by the first, second and third brackets 210, 220, and 230 such that the card CA is inserted into the first accommodation space S1, and the card CA may be secured to be in contact with the plurality of protrusions 140*a*, 140*b*, and 140*c* of the cover structure 110.

The first accommodation guide 212 may extend from the first side cover 120*a* toward the second side cover 120*b*. The first accommodation guide 212 may extend from the first side cover 120*a* to the plurality of protrusions 140*a*, 140*b*, 140*c* of the cover structure 110. The first accommodation guide 212 may extend in the first horizontal direction (X direction) from the first side cover 120*a* by a first length L1.

The first accommodation guide 212 may protrude in the vertical direction (Z direction) downwardly from the first upper surface US1 of the first support structure 131. The first accommodation guide 212 may restrict a movement of the card CA in the vertical direction (Z direction). Additionally, the first support structure 131 may restrict a movement of the card CA in the second horizontal direction (Y direction) so that the card CA does not escape from the first accommodation space S1.

In example embodiments, the second bracket 220 may have a second accommodation guide 222, a third accommodation guide 224, and a second attachment portion AR2 provided on the cover structure 110. Each of thicknesses of the second accommodation guide 222 and the third accommodation guide 224 may be greater than a thickness of the second attachment portion AR2. The second bracket 220 may be fixedly attached on the cover structure 110. For example, the second attachment portion AR2 of the second bracket 220 may be attached on the second support structure 133 of the cover structure 110. A second lower surface BS2 of the second attachment portion AR2 may be attached to a second top surface US2 of the second support structure 133 by an adhesive member AM.

The second accommodation guide 222 may extend in the first horizontal direction (X direction), and the third accommodation guide 224 may extend from the second accommodation guide 222 in the second horizontal direction (Y direction).

The second bracket 220 may be disposed spaced apart from the first bracket 210 on the cover structure 110. The second bracket 220 and the first bracket 210 may guide the card CA into the first accommodation space S1. Additionally, the second bracket 220 and the third bracket 230 may guide the card CA to the second accommodation space S2.

The second accommodation guide 222 may guide the card CA to the first accommodation space S1. For example, the first accommodation space S1 may be defined by the first accommodation guide 212, the second accommodation guide 222 of the second bracket 220 and the fifth accommodation guide 234 of the third bracket 230. The card CA may be guided by the first, second and third brackets 210, 220, and 230 such that the card CA is inserted into the first accommodation space S1, and the card CA may be secured to be in contact with the plurality of protrusions 140*a*, 140*b*, and 140*c* of the cover structure 110.

The second accommodation guide 222 may extend from the first side cover 120*a* of the cover structure 110 toward the second side cover 120*b*. The second accommodation guide 222 may extend in the first horizontal direction (X direction) from the first side cover 120*a* by a second length L2.

The second accommodation guide 222 may protrude in the vertical direction (Z direction) downwardly from the second upper surface US2 of the second support structure 133. The second accommodation guide 222 may restrict a movement of the card CA in the vertical direction (Z direction). Additionally, the first horizontal portion 133*a* of the second support structure 133 may restrict a movement of the card CA in the second horizontal direction (Y direction) so that the card CA does not escape from the first accommodation space S1.

The third accommodation guide 224 may guide the card CA into the second accommodation space S2. For example, the second accommodation space S2 may be defined by the third accommodation guide 224, the first accommodation guide 212 of the first bracket 210, and the fourth accommodation guide 232 of the third bracket 230. The card CA may be guided by the first, second and third brackets 210, 220, and 230 such that the card is inserted into the second accommodation space S2, and the card may be secured to be in contact with a first end portion of the first support structure 131, which serves as the second closed side portion EL4 of the second accommodation space S2.

The third accommodation guide 224 may extend from the second accommodation guide 222 to the third side cover 120*c* of the cover structure 110. The third accommodation guide 224 may extend in the second horizontal direction (Y direction) from the second accommodation guide 222 by a third length L3.

The third accommodation guide 224 may protrude in the vertical direction (Z direction) downwardly from the second upper surface US2 of the second support structure 133. The third accommodation guide 224 may restrict a movement of the card CA in the vertical direction (Z direction). Additionally, the second horizontal portion 133*b* of the second support structure 133 may restrict a movement of the card CA in the first horizontal direction (X direction) so that the card CA does not escape from the second accommodation space S2.

In example embodiments, the third bracket 230 may have a fourth accommodation guide 232, a fifth accommodation guide 234, and a third attachment portion AR3 provided on the cover structure 110. Each of thicknesses of the fourth accommodation guide 232 and the fifth accommodation guide 234 may be greater than a thickness of the third attachment portion AR3. The third bracket 230 may be fixedly attached on the cover structure 110. For example, the third attachment portion AR3 of the third bracket 230 may be attached on the third support structure 135 of the cover structure 110. The third lower surface BS3 of the third attachment portion AR3 may be attached on a third upper surface US3 of the third support structure 135 by an adhesive member AM.

The fourth accommodation guide 232 may extend in the second horizontal direction (Y direction), and the fifth accommodation guide 234 may extend from the fourth accommodation guide 232 in the first horizontal direction (X direction).

The third bracket 230 may be disposed spaced apart from the first bracket 210 and the second bracket 220 on the cover structure 110. The third bracket 230, the first bracket 210, and the second bracket 220 may guide the card CA into the first accommodation space S1. Additionally, the third bracket 230 and the second bracket 220 may guide the card CA to the second accommodation space S2.

The fourth accommodation guide 232 may guide the card CA into the second accommodation space S2. For example, the second accommodation space S2 may be defined by the first accommodation guide 212 of the first bracket 210 and the third accommodation guide 224 of the second bracket 220. The card CA may be guided by the second and third brackets 220, 230 such that the card CA is inserted into the second accommodation space S2, and the card CA may be secured to be in contact with a first end portion of the first support structure 131, which serves as the second closed side portion EL4 of the second accommodation space S2.

The fourth accommodation guide 232 may extend from the third side cover 120*c* of the cover structure 110 towards the fourth side cover 120*d*. The fourth accommodation guide 232 may extend in the second horizontal direction (Y direction) from the third side cover 120*c* by a fourth length L4.

The fourth accommodation guide 232 may protrude in a vertical direction (Z direction) downwardly from the third upper surface US3 of the third support structure 135. The fourth accommodation guide 232 may restrict a movement of the card CA in the vertical direction (Z direction). Additionally, the first horizontal portion 135*a* of the third support structure 135 may restrict a movement of the card CA in the first horizontal direction (X direction) so that the card CA does not escape from the second accommodation space S2.

The fifth accommodation guide 234 may guide the card CA into the first accommodation space S1. For example, the first accommodation space S1 may be defined by the fifth accommodation guide 234, the first accommodation guide 212 of the first bracket 210, and the second accommodation guide 222 of the second bracket 220. The card CA may be guided by the first to third brackets 210, 220, 230 such that the card CA is inserted into the first accommodation space S1, and the card CA may be secured to be in contact with the plurality of protrusions 140*a*, 140*b*, 140*c* of the cover structure 110.

The fifth accommodation guide 234 may extend from the fourth accommodation guide 232 to the fourth side cover 120*d* of the cover structure 110. The fifth accommodation guide 234 may extend in a first horizontal direction (X direction) from the fourth accommodation guide 232 by a fifth length L5.

The fifth accommodation guide 234 may protrude in a vertical direction (Z direction) downwardly from the third upper surface US3 of the third support structure 135. The fifth accommodation guide 234 may restrict a movement of the card CA in the vertical direction (Z direction). Additionally, the second horizontal portion 135*b* of the third support structure 135 may restrict a movement of the card CA in the second horizontal direction (Y direction) so that the card CA does not escape from the first accommodation space S1.

The adhesive member for attaching the first to third brackets 210, 220, 230 to the cover structure 110 may include an epoxy molding compound (EMC), epoxy resin, UV resin, polyurethane resin, silicone resin, silica filler, or the like.

In example embodiments, an upper reinforcement structure 300 may include a first upper reinforcement structure 310 and a second upper reinforcement structure 320 respectively provided in the accommodation spaces S1 and S2 of the card accommodation portion 200. The first upper reinforcement structure 310 may be provided with first, second and third upper reinforcement ribs 310*a*, 310*b*, and 310*c*, and the second upper reinforcement structure 320 may be provided with fourth, fifth and sixth upper reinforcement ribs 320*a*, 320*b* and 320*c*.

The first upper reinforcement structure 310 and the second upper reinforcement structure 320 may be provided with a plurality of structures that respectively protrude from the upper surface 112 of the plate 111 of the cover structure 110. For example, the first upper reinforcement structure 310 may be provided with the first, second and third upper reinforcement ribs 310*a*, 310*b* and 310*c* that protrude from the upper surface 112 of the plate 111 of the cover structure 110 in the first accommodation space S1 and are spaced apart from each other along the first horizontal direction (X direction). Additionally, the second upper reinforcement structure 320 may be provided with the fourth, fifth and sixth upper reinforcement ribs 320*a*, 320*b*, 320*c* that protrude from the upper surface of the cover structure 110 in the second accommodation space S2 and are spaced apart from each other along the second horizontal direction (Y direction).

Upper surfaces 312a, 312b, 312c, 322a, 322b, 322c of the first to six upper reinforcement ribs may be parallel to the upper surface 112 of the plate 111 of the cover structure 110.

The first upper reinforcement structure 310 may be provided in the second accommodation space S2. For example, the first to third upper reinforcement ribs 310a, 310b, 310c may be spaced apart from each other along the second horizontal direction (Y-direction) between the second open side portion EL3 of the second accommodation space S2 and the second closed side portion EL4 of the second accommodation space S2, and the second open side portion EL3 and the second closed side portion EL4 may be opposite each other. For example, the first upper reinforcement rib 310a may be disposed adjacent to the third side cover 120c of the second accommodation space S2 into which the card CA is inserted, and the third upper reinforcement rib 310c may be disposed adjacent to the first support structure 131 that is provided to be in contact with the card CA. The second upper reinforcement rib 310b may be provided between the first and third upper reinforcement ribs 310a and 310c. For example, the first upper reinforcement structure 310 may connect between the first and second side covers 120a, 120b of the cover structure 110, the first and second side covers 120a, 120b facing each other.

The first upper reinforcement structure 310 may be provided with inclined portions that respectively include an inclined surface. The inclined portions may be structures configured to help to easily introduce the card CA into the second accommodation space S2. The inclined surfaces may be arranged to face the second open side portion EL3 of the second accommodation space S2 into which the card CA is inserted. For example, the inclined surface of the first upper reinforcing rib 310a may have a first angle AN1 with respect to the upper surface 312a of the first upper reinforcing rib 310a. The inclined surface of the second upper reinforcement rib 310b may have a second angle AN2 with respect to the upper surface 312b of the second upper reinforcement rib 310b. The inclined surface of the third upper reinforcement rib 310c may have a third angle AN3 with respect to the upper surface 312c of the third upper reinforcement rib 310c.

For example, the third angle AN3 may be greater than the first angle AN1 and the second angle AN2. The first angle AN1 and the second angle AN2 may be the same. For example, the first angle AN1 and the second angle AN2 may be about 44 degrees, and the third angle AN3 may be about 50 degrees. Thus, the card may be easily introduced by the inclined surface of each of the first to third upper reinforcement ribs 310a, 310b, 310c from the second open side portion EL3 to the second closed side portion EL4 of the second accommodation space S2.

The first to third angles may be determined in consideration of a degree to which the card CA bends downward, physical properties of the card CA, dimensions of the card CA, and the like. For example, the first to third angles may be determined in consideration on whether the card CA is easily introduced into the first accommodation space S2.

The second upper reinforcement structure 320 may be provided in the first accommodation space S1. For example, the fourth to sixth upper reinforcement ribs 320a, 320b and 320c may be spaced apart from each other along the first horizontal direction (X-direction) between the first open side portion EL1 of the first accommodation space S1 and the first closed side portion EL2 of the first accommodation space S1, and the first open side portion EL1 and the first closed side portion EL2 may be opposite each other. For example, the fourth upper reinforcement rib 320a may be disposed adjacent to the second side cover 120b of the first accommodation space S1 into which the card CA is inserted, and the sixth upper reinforcement rib 320c may be disposed adjacent to the plurality of protrusions 140a, 140b, 140c of the cover structure 110 that is provided to be in contact with the card CA. The fifth upper reinforcement rib 320b may be provided between the fourth and sixth upper reinforcement ribs 320a, 320c. For example, the second upper reinforcement structure 320 may extend between the third side cover 120c and the first support structure 131 of the cover structure 110.

The second upper reinforcement structure 320 may be provided with inclined portions that respectively include an inclined surface. The inclined portions may be structures configured to help to introduce of the card CA into the first accommodation space. The inclined surfaces may be arranged to face the first open side portion EL1 of the first accommodation space S1 into which the card CA is inserted. For example, the inclined surface of the fourth upper reinforcement rib 320a may have a first angle AN1 with respect to the upper surface 322a of the fourth upper reinforcement rib 320a. The inclined surface of the fifth upper reinforcement rib 320b may have a second angle AN2 with respect to the upper surface 322b of the fifth upper reinforcement rib 320b. The inclined surface of the sixth upper reinforcement rib 320c may have a third angle AN3 with respect to the upper surface 322c of the sixth upper reinforcement rib 320c.

For example, the third angle AN3 may be greater than the first angle AN1 and the second angle AN2. The first angle AN1 and the second angle AN2 may be the same. For example, the first angle AN1 and the second angle AN2 may be about 44 degrees, and the third angle AN3 may be about 50 degrees. Thus, the card may be easily introduced by the inclined surface of each of the fourth to sixth upper reinforcing ribs from the first open side portion EL1 to the first closed side portion EL2 of the first accommodation space.

The first to third angles may be determined in consideration of a degree to which the card CA bends downward, physical properties of the card CA, dimensions of the card CA, and the like. For example, the first to third angles may be determined in consideration on whether the card CA is easily introduced into the first accommodation space S1.

Referring again to FIG. 6, a first recess R1 may be provided on the upper surface 312c of the third upper reinforcement rib 310c of the first upper reinforcement structure 310. The first recess may serve to introduce the card CA into the first accommodation space S1. For example, the first recess R1 may be defined by the upper surface 312c of the third upper reinforcement rib 310c, a first side portion of the first support structure 131, and the lower surface of the first accommodation guide 212. One side portion of the card CA may be secured by the first recess to prevent the card from escaping from the first accommodation space S1.

A distance between the lower surface of the first accommodation guide 212 and the upper surface 312c of the third upper reinforcement rib 310c may be a first height H1. For example, the first height H1 may be within a range of 1 mm to 5 mm. For example, the first height H1 may be about 2 mm.

Referring again to FIG. 10, a first portion of a second recess R2 may be provided on an upper surface 322a of the fourth upper reinforcement rib 320a of the second upper reinforcement structure 320. The first portion of the second recess R2 may extend in the second horizontal direction (Y direction) and may serve to introduce the card CA into the second accommodation space S2. For example, the first portion of the second recess R2 may be defined by the upper surface 322*a* of the fourth upper reinforcement rib 320*a*, a side portion of the second support structure 133 and a lower surface of the third accommodation guide 224. A side portion of the card CA may be secured in the second accommodation space S2 by the first portion of the second recess to prevent the card form escaping from the second accommodation space S2.

Although not shown in the figures, a second portion of the second recess R2 may be provided on the upper surface 312*a* of the first upper reinforcement rib 310*a* of the second upper reinforcement structure 320. The second portion of the second recess R2 may extend in the first horizontal direction (X direction) and may serve to introduce the card CA into the first accommodation space S1. For example, the second portion of the second recess R2 may be defined by the upper surface 312*a* of the first upper reinforcement rib 310*a*, a side portion of the second support structure 133, and a lower surface of the second accommodation guide 222. A side portion of the card CA may be secured in the first accommodation space S1 by the second portion of the second recess to prevent the card from sliding out of—or otherwise escaping from—the first accommodation space S1.

A distance between the lower surface of the second accommodation guide 222 and the upper surface 312*a* of the first upper reinforcement rib 310*a* may have a second height H2. Also, a distance between the lower surface of the third accommodation guide 224 and the upper surface 320*a* of the fourth upper reinforcement rib 320*a* may have the second height H2. For example, the second height H2 may be within a range of 1 mm to 5 mm. For example, the second height H2 may be about 2 mm.

Referring again to FIG. 9, a first portion of a third recess R3 may be provided on an upper surface 322*c* of the sixth upper reinforcement rib 320*c* of the second upper reinforcement structure 320. The first portion of the third recess may extend in the second horizontal direction (Y direction) and may serve to introduce the card CA into the second accommodation space S2. For example, the first portion of the third recess R3 may be defined by the upper surface 322*c* of the sixth upper reinforcement rib 320*c*, a side portion of the third support structure 135 and a lower surface of the fourth accommodation guide 232. A side portion of the card CA may be secured in the second accommodation space S2 by the first portion of the third recess preventing the card from sliding out of—or otherwise escaping from—the second accommodation space S2.

Although not shown in the figures, a second portion of the third recess R3 may be provided on the upper surface 312*a* of the first upper reinforcement rib 310*a* of the first upper reinforcement structure 310. The second portion of the third recess may extend in the first horizontal direction (X direction) and may serve to introduce the card CA into the first accommodation space S1. For example, the second portion of the third recess R3 may be defined by the upper surface 312*c* of the third upper reinforcement rib 310*c*, a side portion of the third support structure 135, and the lower surface of the fifth accommodation guide 234. A side portion of the card CA may be secured by the second portion of the third recess preventing the card from escaping from the first accommodation space S1.

A distance between the lower surface of the fourth accommodation guide 232 and the upper surface 322*c* of the sixth upper reinforcement rib 320*c* may have a third height H3. A distance between the lower surface of the fifth accommodation guide 234 and the upper surface of the first upper reinforcement rib 310*a* may have the third height H3. For example, the third height H3 may be within a range of 1 mm to 5 mm. For example, the third height H3 may be about 2 mm.

In example embodiments, the tag accommodation portion 400 may be provided on the lower region LR of the cover structure 110 to be spaced apart from the card accommodation portion 200 in the second horizontal direction (Y direction). The tag accommodation portion 400 may have cavity CV provided a central portion of the tag accommodation portion 400, and may be provided with first to fourth protective walls 400*a*, 400*b*, 400*c*, 400*d* surrounding the cavity CV. For example, the first protective wall 400*a* and the second protective wall 400*b* may face each other extending in the second horizontal direction (Y direction), and the third protective wall 400*c* and the fourth protective wall 400*d* may face each other extending in the first horizontal direction (X direction). A storage device may be provided in the cavity. The storage device may be provided with data of a semiconductor device SD accommodated in the semiconductor device case 10. The first to fourth protective walls may be structures for preventing the storage device from being damaged by external forces. For example, the storage device may be a radio frequency identification (RFID) tag.

In example embodiments, the lower reinforcement structure 500 may be provided with a first lower reinforcement structure 510 and a second lower reinforcement structure 520 respectively provided within the cavity CV of the tag accommodation portion 400. The first lower reinforcement structure 510 may be provided with at least one first lower reinforcement rib 510*a*, and the second lower reinforcement structure 520 may be provided with second and third lower reinforcement ribs 520*a*, 520*b*.

The storage device may be attached by an adhesive member provided on an upper surface of the first lower reinforcement structure 510 and the second lower reinforcement structure 520.

The at least one first lower reinforcement rib 510*a* may be arranged along the second horizontal direction (Y direction) between the third protective wall 400*c* and the fourth protective wall 400*d*. The at least one first lower reinforcement rib 510*a* may extend in the first horizontal direction (X direction) and may connect the first and second protective walls 400*a*, 400*b* facing each other.

The second and third lower reinforcement ribs 520*a*, 520*b* may be spaced apart sequentially along the first horizontal direction (X direction) between the first protective wall 400*a* and the second protective wall 400*b*. The second and third lower reinforcement ribs 520*a*, 520*b* may extend in the second horizontal direction (Y direction) and may connect the third and fourth protective walls 400*c*, 400*d* facing each other.

In example embodiments, the banding guides 600 may include a first pair of banding guide structures 610*a*, 610*b* and a second pair of banding guide structures 620*a*, 620*b*. The banding guide structures 610*a*, 610*b*, 620*a*, and 620*b* may be structures configured to inhibit separation of band(s) for securing the semiconductor device case 10.

The first pair of banding guide structures 610*a*, 610*b* may be adjacent to the second side cover 120*b* of the cover structure 110. For example, the cover structure 110 may be provided with a first trench TR1 that is adjacent to the second side cover 120*b* and is defined by the first support structure 131 and the second support structure 133. The first trench TR1 may be an opening through which the card CA is introduced into the first accommodation space S1. The first pair of banding guide structures 610*a*, 610*b* may face the first trench and may be adjacent to the second side cover 120*b*.

The first pair of banding guide structures 610*a*, 610*b* may be spaced apart from each other in the second horizontal direction (Y direction) to have a predetermined spacing distance.

The second pair of banding guide structures 620*a*, 620*b* may be adjacent to the fourth side cover 120*d* of the cover structure 110. For example, the cover structure 110 may be adjacent to the third side cover 120*c* and may be provided with a second trench TR2 that is defined by the second support structure 133 and the third support structure 135. The second trench TR2 may be an opening through which the card CA is introduced into the second accommodation space S2. The second pair of banding guide structures 620*a*, 620*b* may face the second trench and may be adjacent to the fourth side cover 120*d*, The second pair of banding guide structures 620*a* and 620*b* may be spaced apart from each other in the first horizontal direction (X direction), having a predetermined spacing distance.

In example embodiments, the plurality of anti-slip pads 700 may be provided on each of corners of the cover structure 110 to protrude from the upper surface 112 of the cover structure 110 along the vertical direction (Z direction).

Figure 12:
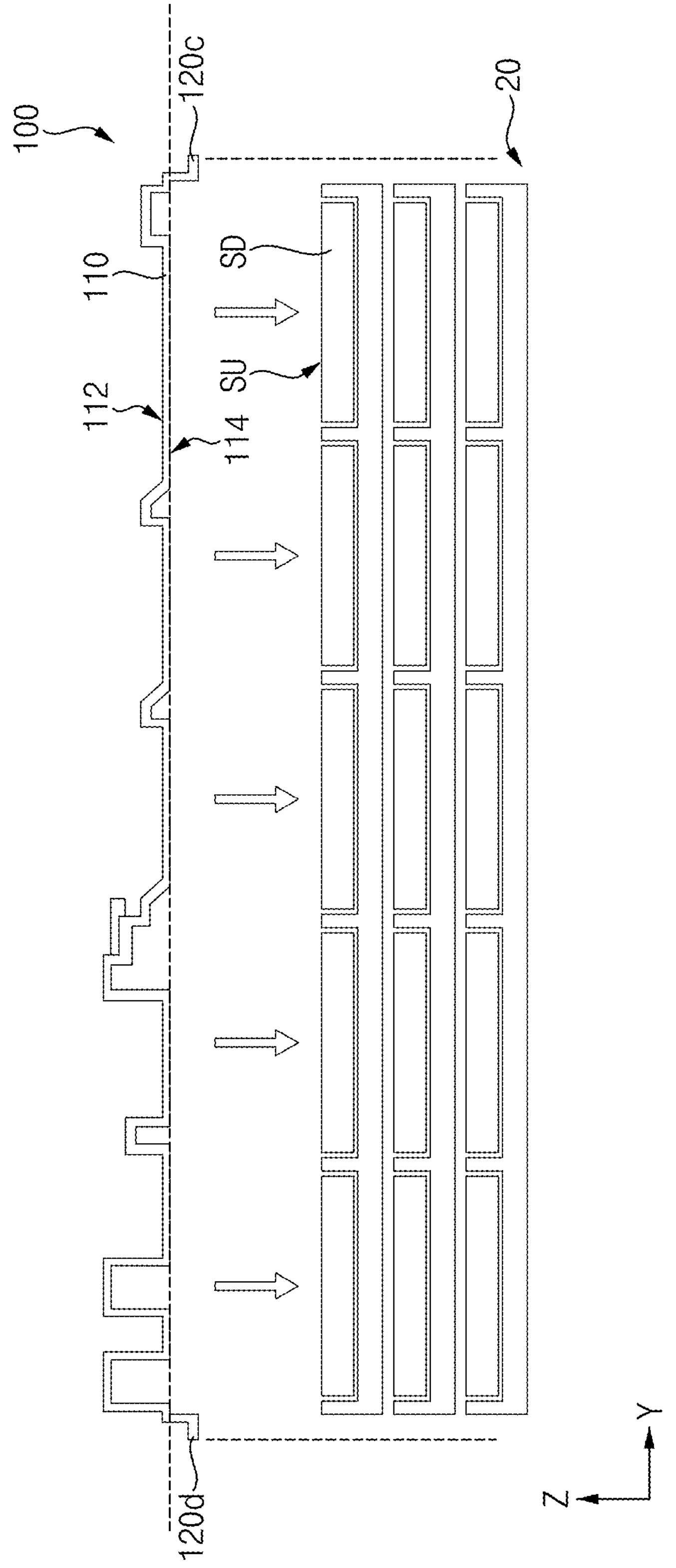
FIGS. 12 and 13 are views illustrating a module tray cover covering a plurality of module trays.
Figure 13:
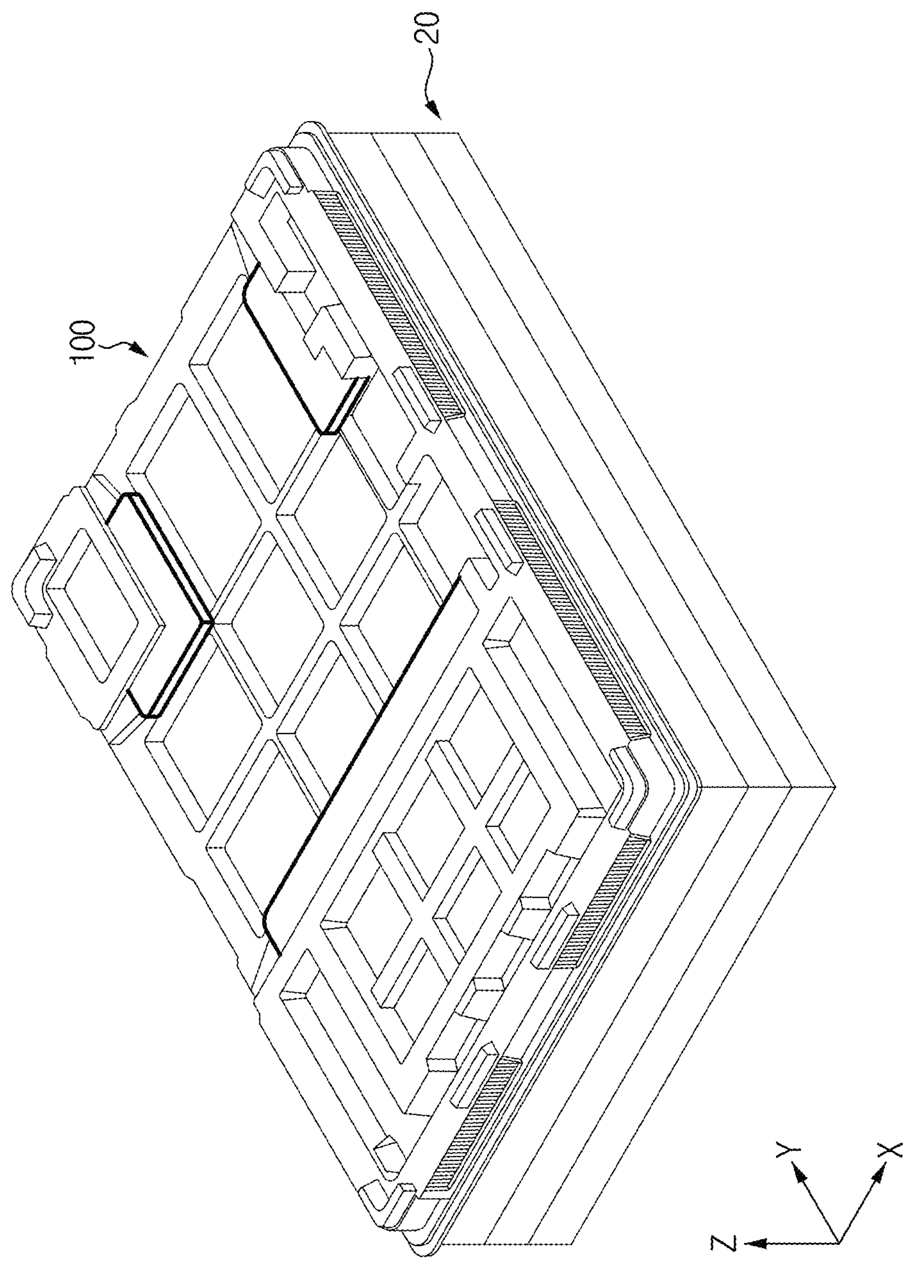

FIGS. 12 and 13 are views illustrating a module tray cover covering a plurality of module trays.

The semiconductor device case 10 may include a plurality of module trays 20 that respectively accommodate the plurality of semiconductor device SD. The plurality of module trays 20 may be stacked in a vertical direction (Z direction). The module tray cover 100 may be provided on an uppermost module tray 20 of the plurality of module trays 20.

Figure 14:
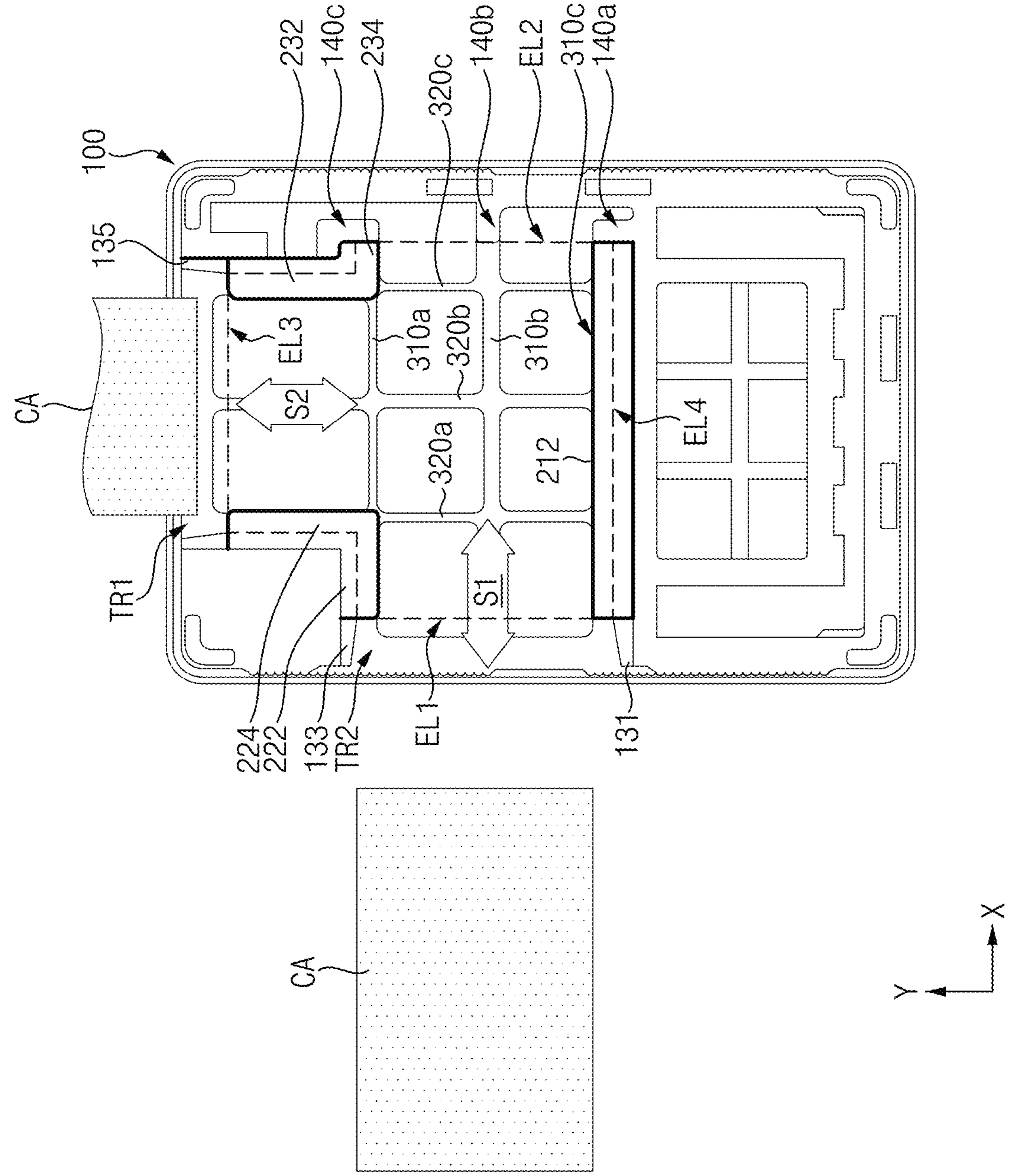
FIGS. 14 to 16 are plan views illustrating card accommodation directions into a module tray cover.
Figure 15:
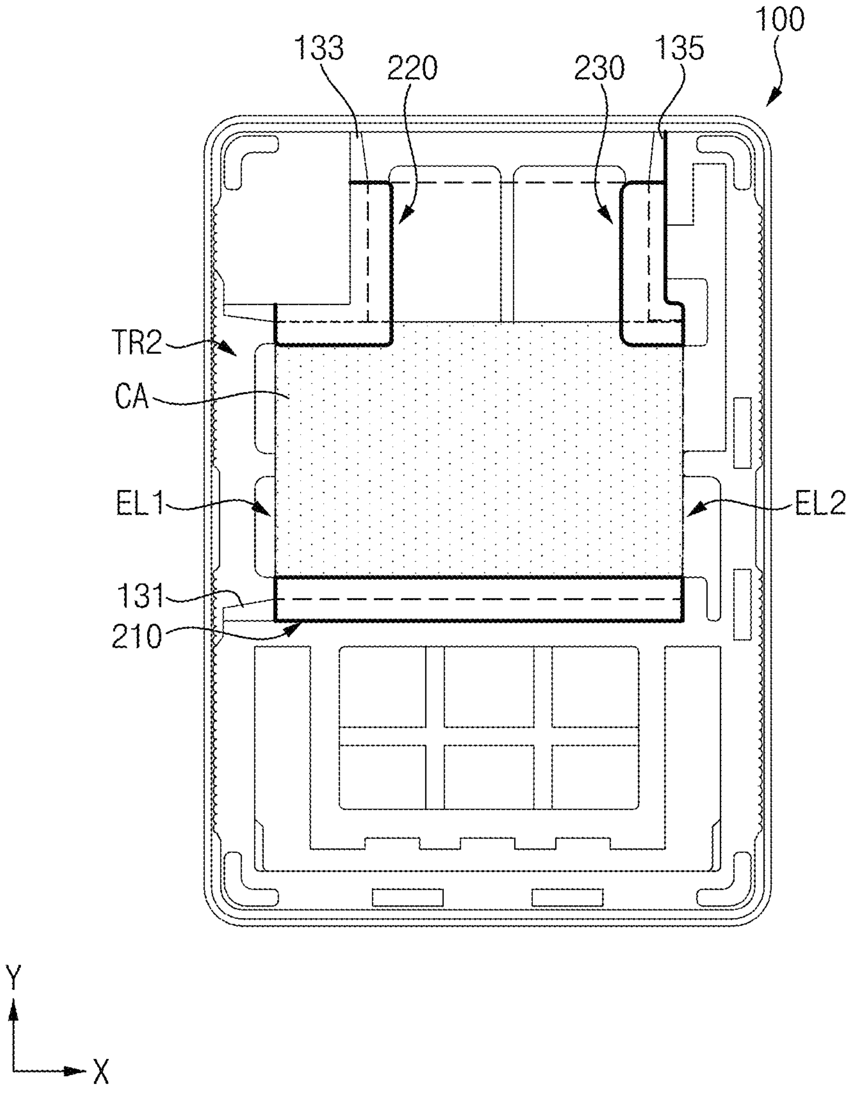
Figure 16:
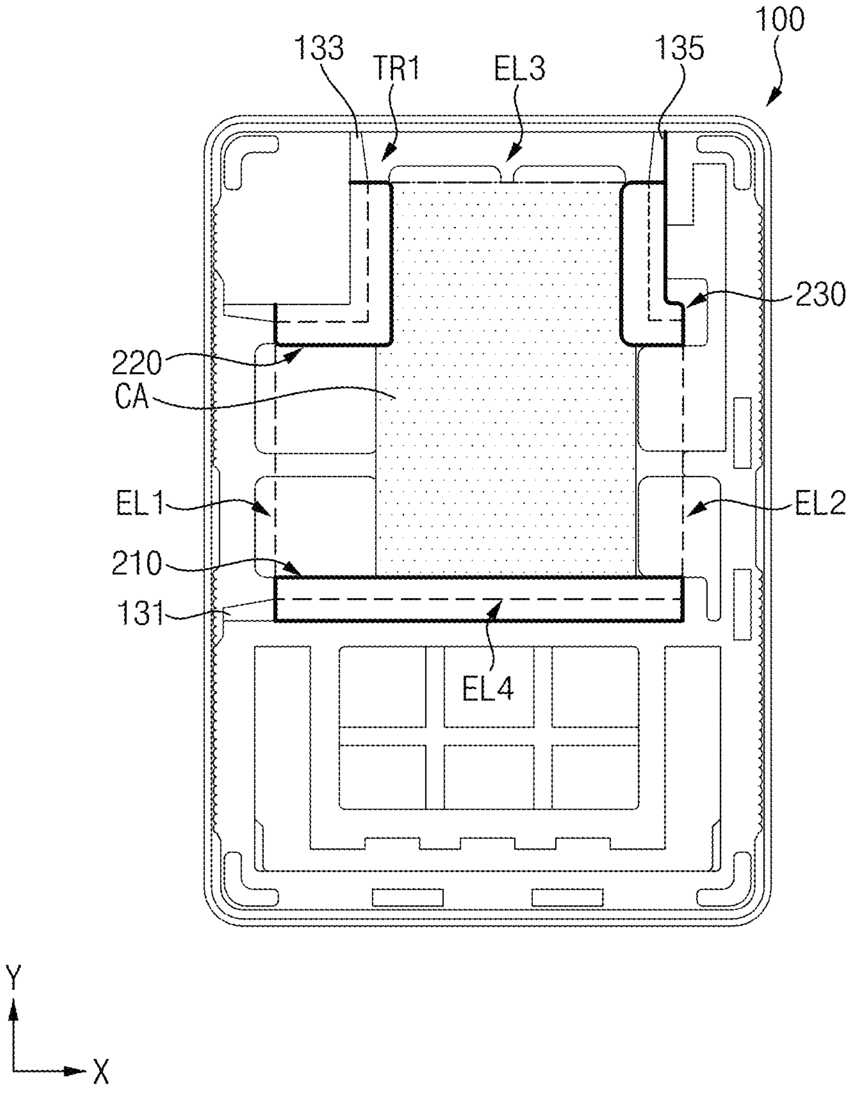

FIGS. 14 to 16 are plan views illustrating insertion directions of cards introduced into a module tray cover.

The card CA may be provided within a first accommodation space S1 and a second accommodation space S2.

The first accommodation space S1 may be provided along a first horizontal direction (X direction) from the second trench TR2 of the cover structure 110 to the plurality of protrusions 140*a*, 140*b*, and 140*c* of the cover structure 110. The card CA may be inserted or removed into the first accommodation space S1 along the first horizontal direction (X direction).

The second accommodation space S2 may be provided along a second horizontal direction (Y direction) from the first trench TR1 of the cover structure 110 to the first support structure 131 of the cover structure 110. The card CA may be inserted or removed into the second accommodation space S2 along the second horizontal direction (Y direction).

Thus, if semiconductor devices are transported by using the semiconductor device case 10, the card CA may be inserted or removed in the first horizontal direction (X direction) or the second horizontal direction (Y direction), so insertion and removal of the card CA may not be limited to a direction in which the semiconductor device case 10 is installed in a process equipment.

Figure 17:
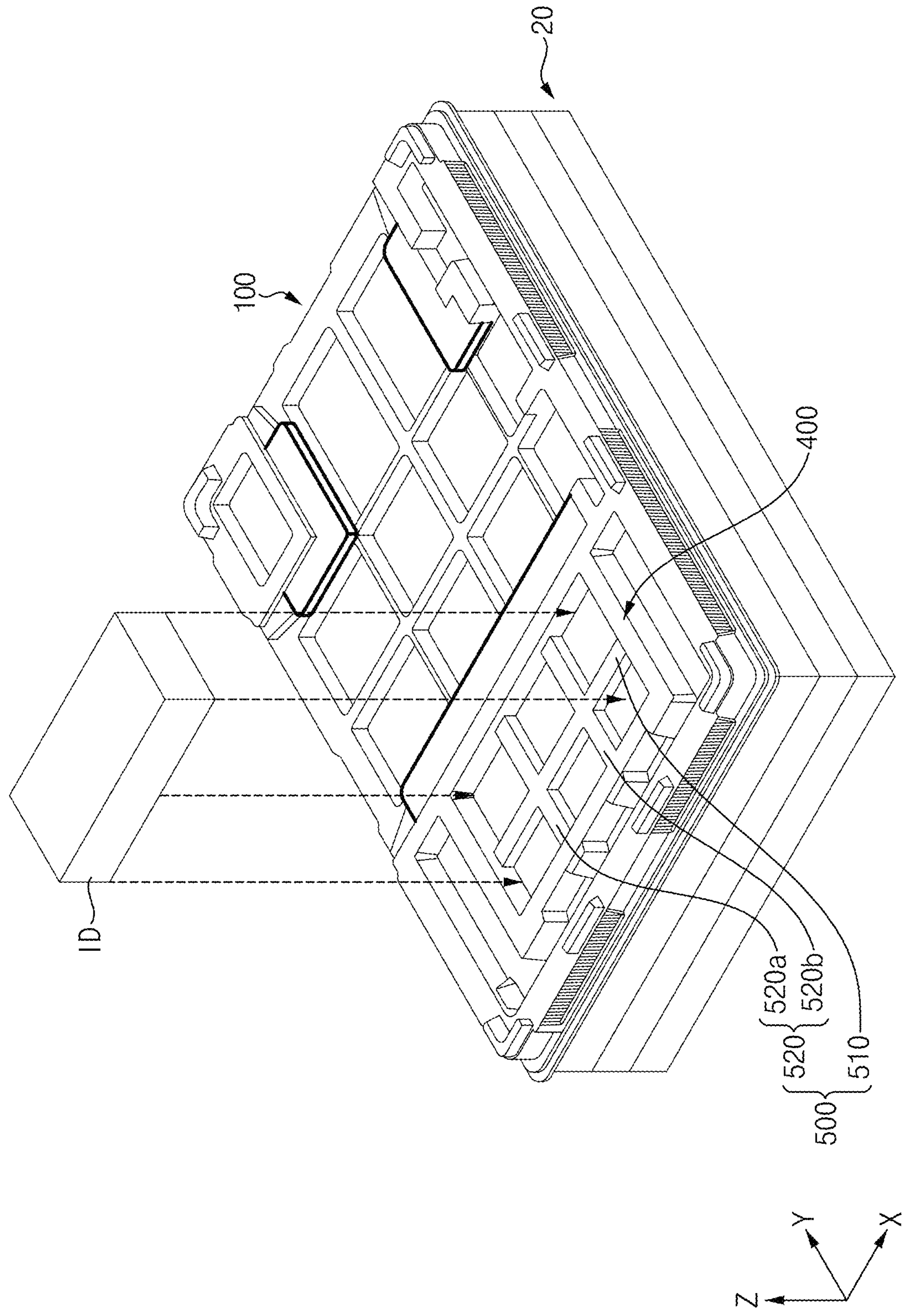
FIG. 17 is a perspective view illustrating a radio frequency identification tag being accommodated on a module tray cover.

FIG. 17 is a perspective view illustrating a radio frequency identification tag being accommodated on a module tray cover.

The semiconductor device case 10 may further be provided with a storage device on which data of the semiconductor device is stored. The storage device may include a radio frequency identification (RFID) tag on which the data of the semiconductor device is stored. The storage device may transmit and receive the data of the semiconductor device using a magnetic or electrical field.

The storage device may be provided on the lower reinforcement structure 500 disposed within the tag accommodation portion 400 of the module tray cover 100.

Thus, information of the semiconductor device may be easily tracked through the storage device.

Figure 18:
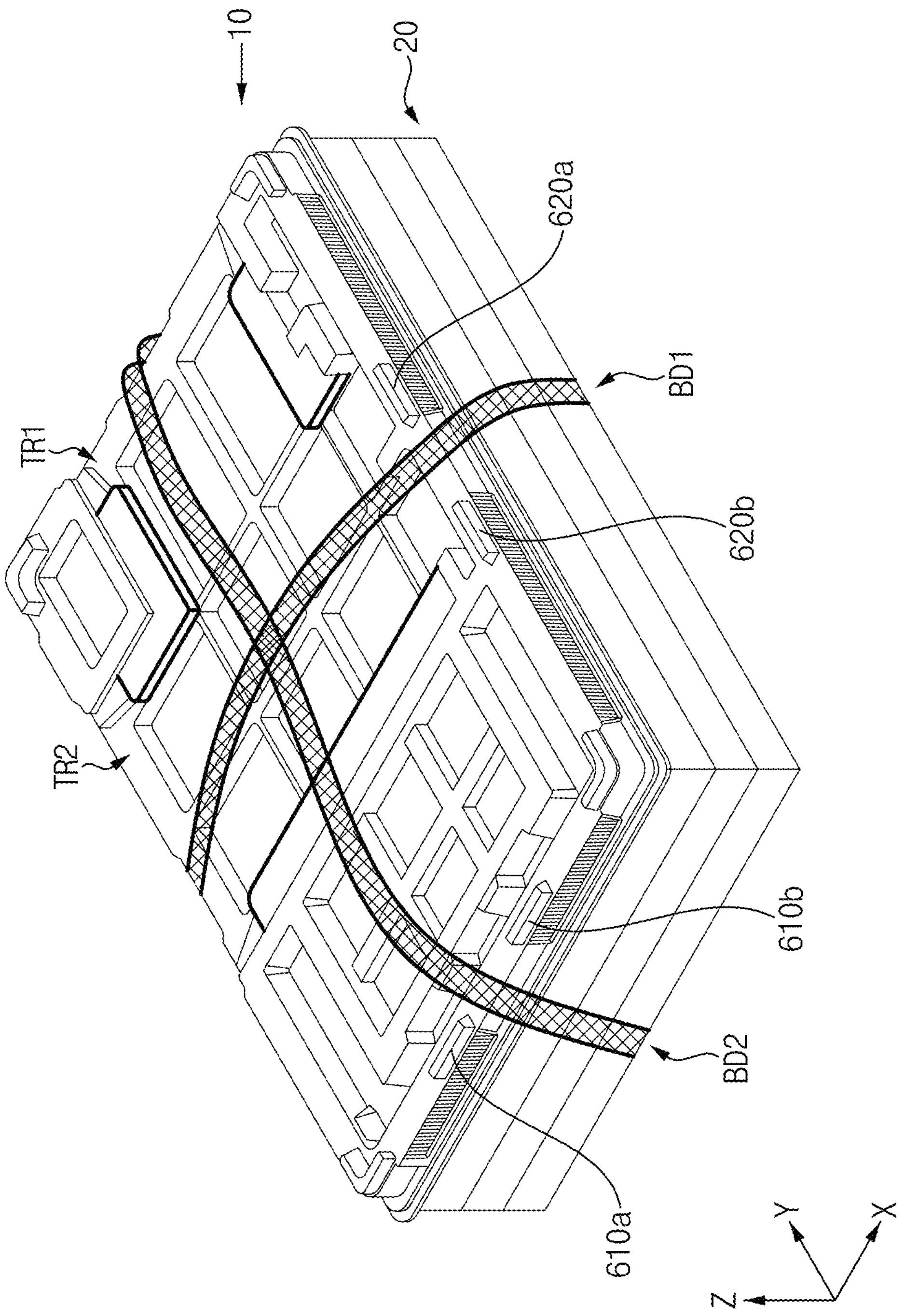
FIG. 18 is a perspective view illustrating a plurality of bands securing a semiconductor device case.

FIG. 18 is a perspective view illustrating a plurality of bands securing a semiconductor device case.

The semiconductor device case 10 may further be provided with a plurality of bands BD1 and BD2 configured to secure the module tray cover 100 and a plurality of module trays 20 that respectively accommodate the plurality of semiconductor devices SD.

The plurality of bands BD1 and BD2 may wrap around outer surfaces of the module tray cover 100 and the plurality of module trays 20 to physically secure the module tray cover 100 and the plurality of module trays 20. For example, the first band BD1 may extend between a second trench TR2 and a second pair of banding guide structures 620*a* and 620*b* along the first horizontal direction (X direction) to secure the semiconductor device case 10. Additionally, the second band BD2 may extend between the first trench TR1 and a first pair of banding guide structures 610*a* and 610*b* along the second horizontal direction (Y direction) to secure the semiconductor device case 10.

In this case, the first trench TR1, the second trench TR2, the first pair of banding guide structures 610*a* and 610*b*, and the second pair of banding guide structures 620*a* and 620*b* may prevent the plurality of bands BD1 and BD2 from sliding away from their intended position and towards the edge of the semiconductor device case 10 in such fashion as may cause them to slip off of semiconductor device case 10 or otherwise become ineffective for the purpose of securing semiconductor device case 10.

In some examples, the bands BD1 and BD2 may be formed from an elastic material, such as rubber, nylon, or an elastic polymer (elastomer). In other examples, the bands BD1 and BD2 may be formed from an inelastic material, such as metal, inelastic natural fiber, or an inelastic polymer. In yet other examples, the bands BD1 and BD2 may be formed from a combination of elastic and inelastic materials. In some examples, the bands BD1 and BD2 may be both be formed as single bands of elastic and/or inelastic materials. In other examples, one or both of the bands BD1 and BD2 may comprise a plurality of bands. It is worthy of note that the composition of the bands BD1 and BD2 need not necessarily be the same. For instance, in some examples, one of the bands BD1 and BD2 may comprise a single bands formed from an elastic material, and the other may comprise multiple bands, some or all of which may be formed from an inelastic material or a combination of elastic and inelastic materials.

As described above, the semiconductor device case 10 may include a module tray 20 including an open upper surface UO and a module tray cover 100 configured to cover the module tray 20. The module tray cover 100 may be provided with a cover structure 110, a card accommodation portion 200 provided on an upper surface of the cover structure 110, an upper reinforcement structure 300 provided in an accommodation spaces S1 and S2 of the card accommodation portion 200, a tag accommodation portion 400 spaced apart from the card accommodation portion 200, the lower reinforcement structure 500 provided in the tag accommodation portion 400, and the banding guide 600 provided on a side portion of the cover structure 110. The module tray cover 100 may further be provided with the plurality of anti-slip pads 700.

The plurality of contact portions CP may be provided on a lower surface of the cover structure 110. The plurality of contact portions CP may be in contact with upper surfaces of the plurality of semiconductor devices SD which are accommodated in the module tray 20, so the plurality of contact portions may secure the plurality of semiconductor devices SD.

Accordingly, the plurality of contact portions CP may prevent the plurality of semiconductor devices SD from being damaged due to shaking of the semiconductor device case 10.

The cover structure 110 of the module tray cover 100 may cover the open upper surface UO of the module tray 20 in which the plurality of semiconductor devices SD is exposed.

Accordingly, the cover structure 110 may block foreign substances, particles, etc. from flowing into the plurality of semiconductor device SD in the module tray 20.

The card accommodation portion 200 may be provided with the plurality of brackets 210, 220, and 230 for introducing or accommodate the card CA including information about the plurality of semiconductor devices SD which are accommodated in the module tray 20.

Accordingly, when it is difficult to recognize a data of the plurality of semiconductor devices SD which are accommodated in the module tray 20, the data of the plurality of semiconductor devices SD may be easily recognized using the card CA. Additionally, the card CA may be easily accommodated through the plurality of brackets 210, 220, and 230.

The upper reinforcement structure 300 and the lower reinforcement structure 500 may be provided with a plurality of upper reinforcement ribs and a plurality of lower reinforcement ribs extending in a first horizontal direction (X direction) or a second horizontal direction (Y direction) perpendicular to the first horizontal direction (X direction). Each of the plurality of upper reinforcement ribs of the upper reinforcement structure 300 may provide an inclined portion that has an inclined surface.

Accordingly, the upper reinforcement structure 300 and the lower reinforcement structure 500 may increase a rigidity of the module tray cover 100, so a warpage of the module tray cover 100 may be reduced. Additionally, the inclined portions of each of the upper reinforcement ribs of the upper reinforcement structure 300 may prevent the card CA from being damaged while the card CA is introduced into the accommodation space.

The banding guide 600 may include the pair of banding guide structures 610 and 620, the pair of banding guide structures 610 and 620 being spaced apart from each other in the first horizontal direction (X direction) or the second horizontal direction (Y direction). A band may be located between the pair of banding guide structures 610 and 620, the band being configured to secure the semiconductor device case 10.

Accordingly, the pair of banding guide structures 610 and 620 may prevent the band from sliding away from its intended position and towards the edge of the semiconductor device case 10 in such fashion as may cause it to slip off of semiconductor device case 10 or otherwise become ineffective for the purpose of securing semiconductor device case 10.

Additionally, the module tray cover 100 may further be provided with the radio frequency identification (RFID) tag that stores data about the plurality of semiconductor devices SD, wherein the radio frequency identification tag may be provided in the tag accommodation portion 400.

Accordingly, the data about the plurality of semiconductor devices SD accommodated in the semiconductor device case 10 may be easily tracked through the radio frequency identification tag. Additionally, the tag accommodation portion 400 may prevent the radio frequency identification tag from being damaged.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A module tray cover, comprising:

a cover structure configured to cover a module tray that accommodates a plurality of semiconductor devices;

a card accommodation portion provided on an upper surface of the cover structure and configured to accommodate a card, the card accommodation portion providing a first accommodation space and a second accommodation space, the first accommodation space extending in a first horizontal direction, the second accommodation space extending in a second horizontal direction perpendicular to the first horizontal direction and partially overlapped with the first accommodation space; and an upper reinforcement structure including a first plurality of upper reinforcement structures and a second plurality of upper reinforcement structures, the first plurality of upper reinforcement structures being spaced apart from each other along the first horizontal direction and protruding from the upper surface of the cover structure in the first accommodation space, the second plurality of upper reinforcement structures being spaced apart from each other along the second horizontal direction and protruding from the upper surface of the cover structure in the second accommodation space, wherein the first plurality of upper reinforcement structures includes first, second and third upper reinforcement ribs sequentially disposed along the first horizontal direction from a first open side portion of the first accommodation space through which the card is inserted in the first horizontal direction, each of the first, second and third upper reinforcement ribs providing an inclined portion that has an inclined surface facing the first open side portion of the first accommodation space; and wherein the second plurality of upper reinforcement structures includes fourth, fifth and sixth upper reinforcement ribs sequentially disposed along the second horizontal direction from a second open side portion of the second accommodation space through which the card is inserted in the second horizontal direction, each of the fourth, fifth and sixth upper reinforcement ribs providing an inclined portion that has an inclined surface facing the second open side portion of the second accommodation space.

2. The module tray cover of claim 1, wherein the inclined surface of the first upper reinforcement rib has a first angle with respect to a first upper surface of the first upper reinforcement rib, the inclined surface of the second upper reinforcement rib has a second angle with respect to a second upper surface of the second upper reinforcement rib, and the inclined surface of the third upper reinforcement rib has a third angle with respect to a third upper surface of the third upper reinforcement rib.

3. The module tray cover of claim 2, wherein the third angle is greater than the first angle and the second angle.

4. The module tray cover of claim 3, wherein the first angle is the same as the second angle.

5. The module tray cover of claim 1, wherein the inclined surface of the fourth upper reinforcement rib has a first angle with respect to a first upper surface of the fourth upper reinforcement rib, the inclined surface of the fifth upper reinforcement rib has a second angle with respect to a second upper surface of the fifth upper reinforcement rib, and the inclined surface of the sixth upper reinforcement rib has a third angle with respect to a third upper surface of the sixth upper reinforcement rib.

6. The module tray cover of claim 5, wherein the third angle is greater than the first angle and the second angle.

7. The module tray cover of claim 6, wherein the first angle is the same as the second angle.

8. The module tray cover of claim 1, wherein the cover structure includes, a plate having a first surface and a second surface facing away from each other;

first, second, third and fourth side covers surrounding side portions of the plate; and first, second and third support structures having first, second and third upper surfaces respectively, wherein the card accommodation portion is provided on the first, second and third upper surfaces of the first to third support structures to form first, second and third recesses.

9. The module tray cover of claim 8, wherein the plate of the cover structure has a plurality of contact portions that are provided on a lower surface of the plate and respectively contact upper surfaces of the plurality of semiconductor devices accommodated in the module tray.

10. The module tray cover of claim 1, further comprising:

a radio frequency identification tag spaced from the card accommodation portion along the second horizontal direction and configured to store data of the plurality of semiconductor devices.

11. A module tray cover, comprising:

a cover structure configured to cover a module tray that accommodates a plurality of semiconductor devices, the cover structure including first and second side covers extending in a first horizontal direction and facing each other and third and fourth side covers extending in a second horizontal direction perpendicular to the first horizontal direction and facing each other, the cover structure providing an upper region adjacent to the first side cover and a lower region adjacent to the second side cover;

a card accommodation portion provided on the upper region of the cover structure and configured to accommodate a card, the card accommodation portion having a first accommodation space extending in the first horizontal direction and a second accommodation space extending in the second horizontal direction;

a tag accommodation portion provided on the lower region of the cover structure and configured to accommodate a data storage device that stores data of the plurality of semiconductor devices, the tag accommodation portion including first and second protection walls extending in the first horizontal direction and facing each other, the tag accommodation portion including third and fourth protection walls extending in the second horizontal direction and facing each other;

a lower reinforcement structure disposed between the first, second, third and fourth protection walls, the lower reinforcement structure including a first lower reinforcement structure parallel with the first horizontal direction and a second lower reinforcement structure parallel with the second horizontal direction; and a radio frequency identification tag provided on the lower reinforcement structure that is surrounded by the first, second, third and fourth protection walls and configured to store data of the plurality of semiconductor devices, wherein the first lower reinforcement structure includes at least one lower reinforcement rib between the first protection wall and the second protection wall, the at least one lower reinforcement rib extending between the third protection wall and the fourth protection wall, and wherein the second lower reinforcement structure includes multiple lower reinforcement ribs sequentially arranged in the first horizontal direction between the third protection wall and the fourth protection wall, the multiple lower reinforcement ribs extending between the first protection wall and the second protection wall.

12. The module tray cover of claim 11, wherein the cover structure has a plurality of contact portions that are provided on a lower surface of the cover structure and respectively contact upper surfaces of the plurality of semiconductor devices.

13. The module tray cover of claim 11, further comprising:

a banding guide configured to inhibit separation of a band for securing a plurality of module trays and the module tray cover as the module tray cover covers an uppermost module tray among the plurality of module trays, wherein the plurality of module trays are stacked in a vertical direction and respectively accommodate the plurality of semiconductor devices, wherein the banding guide includes, a first pair of banding guide structures adjacent to the fourth side cover and facing a first open side portion of the first accommodation space; and a second pair of banding guide structures adjacent to the second side cover and facing a second open side portion of the second accommodation space.

14. The module tray cover of claim 11, further comprising:

an upper reinforcement structure including a first plurality of upper reinforcement structures and a second plurality of upper reinforcement structures, the first plurality of upper reinforcement structures being spaced apart along the first horizontal direction and extending between a first open side of the first accommodation space and a first closed side of the first accommodation space, the first open side and the first closed side opposite each other, the second plurality of upper reinforcement structures being spaced apart along the second horizontal direction and extending between a second open side of the second accommodation space and a second closed side of the second accommodation space, the second open side and the second closed side opposite each other.

15. A semiconductor device case, comprising:

a module tray configured to accommodate a plurality of semiconductor devices, the module tray having an open upper surface;

a module tray cover detachably provided on the module tray, the module tray cover including a cover structure configured to cover the open upper surface;

a card accommodation portion provided on an upper region of the cover structure and configured to accommodate a card, the card accommodation portion having a first accommodation space extending in a first horizontal direction and a second accommodation space extending in a second horizontal direction;

a first plurality of upper reinforcement structures including first, second and third upper reinforcement ribs that are sequentially disposed along the first horizontal direction from a first open side portion of the first accommodation space;

a second plurality of upper reinforcement structures including fourth, fifth and sixth upper reinforcement ribs that are sequentially disposed along the second horizontal direction from a second open side portion of the second accommodation space;

a tag accommodation portion spaced apart from the card accommodation portion along the second horizontal direction and configured to accommodate a data storage device that stores data of the plurality of semiconductor devices, the tag accommodation portion including first and second protection walls extending in the first horizontal direction and facing each other, the tag accommodation portion including third and fourth protection walls extending in the second horizontal direction and facing each other; and a lower reinforcement structure disposed between the first to fourth protection walls, the lower reinforcement structure including a lower reinforcement structure parallel with the first horizontal direction and a plurality of lower reinforcement structures parallel with the second horizontal direction, wherein each of the first to third upper reinforcement ribs includes an inclined portion that has an inclined surface facing the first open side portion of the first accommodation space, and wherein the inclined surface of the first upper reinforcement rib has a first angle with respect to a first upper surface of the first upper reinforcement rib, the inclined surface of the second upper reinforcement rib has a second angle with respect to a second upper surface of the second upper reinforcement rib, and the inclined surface of the third upper reinforcement rib has a third angle with respect to a third upper surface of the third upper reinforcement rib.

16. The semiconductor device case of claim 15, wherein the third angle is greater than the first angle and the second angle.

17. The semiconductor device case of claim 15, wherein each of the fourth to sixth upper reinforcement ribs includes an inclined portion that has an inclined surface facing the second open side portion of the second accommodation space, the inclined surface of the fourth upper reinforcement rib has a first angle with respect to a first upper surface of the fourth upper reinforcement rib, the inclined surface of the fifth upper reinforcement rib has a second angle with respect to a second upper surface of the fifth upper reinforcement rib, and the inclined surface of the sixth upper reinforcement rib has a third angle with respect to a third upper surface of the sixth upper reinforcement rib.

18. The semiconductor device case of claim 17, wherein the third angle with respect to the third upper surface of the sixth upper reinforcement rib is greater than the first angle with respect to the first upper surface of the fourth upper reinforcement rib and the second angle with respect to the second upper surface of the fifth upper reinforcement rib.

* * * * *